(12) United States Patent  
Wei et al.

(10) Patent No.: US 8,013,711 B2
(45) Date of Patent: Sep. 6, 2011

(54) VARIABLE RESISTANCE ELEMENT, SEMICONDUCTOR DEVICE, AND METHOD FOR MANUFACTURING VARIABLE RESISTANCE ELEMENT

(75) Inventors: Zhiqiang Wei, Osaka (JP); Takumi Mikawa, Shiga (JP); Takeshi Takagi, Kyoto (JP); Yoshio Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 606 days.

(21) Appl. No.: 12/280,013

(22) PCT Filed: Feb. 27, 2007

(86) PCT No.: PCT/JP2007/053610
§ 371 (c)(1),
(2), (4) Date: Aug. 20, 2008

(87) PCT Pub. No.: WO2007/102341
PCT Pub. Date: Sep. 13, 2007

(65) Prior Publication Data
US 2010/0225438 A1    Sep. 9, 2010

(30) Foreign Application Priority Data
Mar. 9, 2006 (JP) .................................. 2006-064277

(51) Int. Cl.
*H01C 7/10*    (2006.01)
(52) U.S. Cl. ............... 338/20; 338/21; 438/102; 257/2; 365/148
(58) Field of Classification Search .............. 338/20–21; 438/102–103, 672; 365/148, 158, 161, 163; 257/2–4, 246
See application file for complete search history.

(56) References Cited

U.S. PATENT DOCUMENTS

| 6,914,806 | B2 * | 7/2005 | Kunikiyo ...................... 365/158 |
| 7,037,749 | B2 * | 5/2006 | Horii et al. ....................... 438/95 |
| 7,167,387 | B2 | 1/2007 | Sugita et al. |
| 2004/0085833 | A1 | 5/2004 | Hwang et al. |
| 2005/0128799 | A1 | 6/2005 | Kurotsuchi et al. |

(Continued)

FOREIGN PATENT DOCUMENTS

JP            05-021740            1/1993
(Continued)

OTHER PUBLICATIONS

English translation of Chinese Office Action issued in Chinese Patent Application No. CN 200780007386.7 dated Oct. 16, 2009.

*Primary Examiner* — Kyung Lee
(74) *Attorney, Agent, or Firm* — McDermott Will & Emery LLP

(57) ABSTRACT

A method for manufacturing a variable resistance element includes the steps of: depositing a variable resistance material (106) in a contact hole (105), which is formed on an interlayer insulating layer (104) on a substrate and has a lower electrode (103) at a bottom portion thereof, such that an upper surface of the variable resistance material (106) in the contact hole (105) is located lower than an upper surface of the interlayer insulating layer (104); depositing an upper electrode material on the deposited variable resistance material (106) such that an upper surface of the upper electrode material in the contact hole (105) is located higher than the upper surface of the interlayer insulating layer (104); and element-isolating by a CMP the variable resistance element including the variable resistance material (106) and the upper electrode material.

12 Claims, 16 Drawing Sheets

U.S. PATENT DOCUMENTS

2006/0215445 A1 9/2006 Baek et al.

FOREIGN PATENT DOCUMENTS

| | | |
|---|---|---|
| JP | 2002-536840 | 10/2002 |
| JP | 2004-128486 | 4/2004 |
| JP | 2004-158852 | 6/2004 |
| JP | 2004-311969 | 11/2004 |
| JP | 2005-120421 | 5/2005 |
| JP | 2005-166210 | 6/2005 |
| JP | 2005-353779 | 12/2005 |
| JP | 2006-032728 | 2/2006 |
| JP | 2006-279042 | 10/2006 |
| WO | WO 00/48196 | 8/2000 |
| WO | WO 2005/041303 A1 | 5/2005 |

* cited by examiner

VARIABLE RESISTANCE ELEMENT, SEMICONDUCTOR DEVICE, AND METHOD FOR MANUFACTURING VARIABLE RESISTANCE ELEMENT

RELATED APPLICATIONS

This application is the U.S. National phase under 35 U.S.C. §371 of International Application No. PCT/JP2007/053610, filed on Feb. 27, 2007, which in turn claims the benefit of Japanese Application No. 2006-064277, filed on Mar. 9, 2006, the disclosures of which Applications are incorporated by reference herein.

TECHNICAL FIELD

The present invention relates to a variable resistance element, a semiconductor device, and a method for manufacturing the variable resistance element. More particularly, the present invention relates to a variable resistance element and a semiconductor device, each of which uses a variable resistance material whose resistance value changes by application of a voltage pulse, and a method for manufacturing the variable resistance element.

BACKGROUND ART

A variable resistance material, such as a CMR (Colossal Magneto-Resistance) material, has such a property that a resistance value thereof largely changes depending on the magnitude and polarity of an applied voltage pulse, and this change is maintained even after the applied voltage is decreased. In recent years, a variable resistance element using the variable resistance material, and semiconductor devices, such as a nonvolatile memory using this variable resistance element, have been developed by utilizing the above property.

As one example, the variable resistance element is configured such that a thin film or a bulk material made of the variable resistance material is sandwiched between a pair of electrodes. In use, an electrical pulse is applied between the electrodes, and this changes the resistance value of the variable resistance material. For example, the application of a positive voltage pulse increases the resistance value (about 1 MΩ for example), and the application of a negative voltage pulse decreases the resistance value (about 1 kΩ for example). As above, the resistance value of the variable resistance material largely changes by the voltage pulse. Therefore, the variable resistance element can be utilized as, for example, a nonvolatile memory element by reading the resistance value using the electrodes.

One conventional variable resistance element and its manufacturing method are disclosed in Patent Document 1. FIG. 39 are cross-sectional views showing the schematic configuration of a variable resistance element array. FIG. 39($a$) shows a cross section parallel to a bit line 28, and FIG. 39($b$) shows a cross section parallel to a word line 23. As shown in FIG. 39, a plurality of variable resistance elements 50 are integrated to constitute a variable resistance element array 500. In the variable resistance element array 500, word lines that are $N^+$ regions 23 are formed on a substrate 21 so as to be in parallel with each other at predetermined intervals. Elements each formed by stacking a $P^+$ region 24, a barrier metal 25, a lower electrode 26, and a PCMO memory material (variable resistance material) 27 are formed on the respective $N^+$ regions 23 at predetermined intervals, and spaces around the elements are filled with an interlayer insulating layer 22. The upper ends of the elements are connected to upper electrodes 28 (bit line) formed in parallel with each other at predetermined intervals. Since the word lines and the bit lines are orthogonal to each other, the elements are arranged in a matrix, and thereby this can be utilized as a memory array.

In a method for manufacturing the variable resistance element array 500, the PCMO memory materials 27 are deposited on the lower electrodes 26, the barrier metals 25, the $P^+$ regions 24, and the $N^+$ regions 23 formed on the substrate 21. The deposited PCMO memory materials 27 are smoothed by CMP (Chemical Mechanical Process), and the upper electrodes 28 are formed on the PCMO memory materials 27.

Patent Document 1: Japanese Laid-Open Patent Application Publication 2004-128486

DISCLOSURE OF THE INVENTION

Problems to be Solved by the Invention

However, when actually manufacturing and using the variable resistance element having the above conventional configuration, its operation is unstable, and its reliability is low.

The present invention was made to solve these problems, and an object of the present invention is to provide a variable resistance element and a semiconductor device, each of which is capable of improving malfunctions of the variable resistance element, and a method for manufacturing the variable resistance element.

Means for Solving the Problems

The present inventors have diligently studied to stabilize the operation of the variable resistance element and improve the reliability of the variable resistance element. As a result of the study, it is found that in a case where the variable resistance material is deposited, and an upper surface of the variable resistance material is smoothed by CMP and/or a side surface of the variable resistance material is formed by etching, the variable resistance material near the surfaces deteriorates. It is thought that the deterioration occurs since the property of the variable resistance material easily changes by oxidization or reduction thereof. The deterioration causes malfunctions of the variable resistance element and the decrease in reliability of the variable resistance element. Based on these findings, the present inventors have found that by forming the electrode itself to be convex toward the variable resistance material, the current concentrates not on a peripheral portion of the variable resistance material but on a center portion of the variable resistance material, and therefore, the variable resistance element is less affected by the side surface which easily deteriorates. In addition, the present inventors have found that in a case where the variable resistance material is deposited, and an electrode material is deposited on the variable resistance material before carrying out the CMP and the etching, an interface between an electrode and a variable resistance layer is less affected by the deterioration.

In order to solve the above problems, a method for manufacturing a variable resistance element of the present invention includes the steps of: depositing a variable resistance material in a contact hole, which is formed on an interlayer insulating layer on a substrate and has a lower electrode at a bottom portion thereof, such that an upper surface of the variable resistance material in the contact hole is located lower than an upper surface of the interlayer insulating layer; depositing an upper electrode material on the deposited variable resistance material such that an upper surface of the upper electrode material in the contact hole is located higher than the upper surface of the interlayer insulating layer; and element-isolating by a CMP the variable resistance element including the variable resistance material and the upper electrode material which is stacked on the variable resistance material.

In this configuration, the interface between the variable resistance material and the upper electrode does not deteriorate due to the CMP. Further, the upper electrode is formed to be convex with respect to the variable resistance layer. Therefore, it is possible to manufacture the variable resistance element which is less affected by the deterioration of the variable resistance material and whose malfunctions are suppressed.

In the method for manufacturing the variable resistance element, the step of depositing the variable resistance material may be carried out by MOD or MOCVD.

In this configuration, it is easy to deposit the variable resistance material such that the variable resistance material has a concave portion in the contact hole. By depositing the upper electrode material to fill in the concave portion, the upper electrode is formed to be convex with respect to the variable resistance layer. Therefore, it is possible to easily manufacture the variable resistance element which is less affected by the deterioration of the variable resistance material and whose malfunctions are suppressed.

Moreover, a method for manufacturing the variable resistance element of the present invention includes the steps of: forming a lower electrode film on a substrate; etching the lower electrode film to form lower electrodes, each having a predetermined width such that the lower electrodes are arranged in a width direction of the lower electrode with predetermined pitches; covering the lower electrodes with silicon oxide or silicon nitride to form an interlayer insulating layer; patterning and etching the interlayer insulating layer to form contact holes, which are communicated with the lower electrodes; depositing a variable resistance material by MOD or MOCVD such that an upper surface of the variable resistance material in the contact hole is located lower than an upper surface of the interlayer insulating layer; depositing an upper electrode material on the deposited variable resistance material such that an upper surface of the upper electrode material in the contact hole is located higher than the upper surface of the interlayer insulating layer; and element-isolating by a CMP the variable resistance element including the variable resistance material and the upper electrode material which is stacked on the variable resistance material.

In this configuration, the variable resistance material and the upper electrode material are sequentially stacked in the contact hole formed by etching, and then smoothing and element-isolating by the CMP are carried out. To be specific, before the CMP, the upper electrode material is stacked on the variable resistance material. Therefore, the interface between the variable resistance layer and the upper electrode does not deteriorate due to the CMP. In accordance with this method, since the state of the interface is maintained satisfactorily, it is possible to easily and surely manufacture a variable resistance element array in which the variable resistance elements, each of which is less affected by the deterioration of the variable resistance material and whose malfunctions are suppressed, are formed in a matrix.

Moreover, in order to solve the above problems, the variable resistance element according to the present invention includes: a variable resistance layer whose resistance value changes in accordance with an applied voltage pulse; and a first electrode and a second electrode sandwiching the variable resistance layer, wherein a surface of the first electrode or the second electrode which surface contacts the variable resistance layer is formed to be convex toward the variable resistance layer.

In this configuration, since the electrode itself is formed to be convex toward the variable resistance material, the current concentrates not on a peripheral portion of the variable resistance material but on a central portion of the variable resistance material, and therefore, the variable resistance element is less affected by the side surface which easily deteriorates. On this account, it is possible to suppress the malfunctions of the variable resistance element.

In the variable resistance element, the variable resistance element may be formed on a substrate; and where one of the first electrode and the second electrode which is closer to the substrate is a lower electrode, and the other one is an upper electrode, the upper electrode may be formed to be convex toward the substrate.

In this configuration, since the upper electrode is formed to be convex toward the variable resistance material, the current concentrates not on the peripheral portion of the variable resistance material but on the central portion of the variable resistance material, and therefore, the variable resistance element is less affected by the side surface which easily deteriorates. On this account, it is possible to suppress the malfunctions of the variable resistance element. Note that the above expression "on a substrate" includes a case where the other layer or material is disposed between the variable resistance element and the substrate.

The variable resistance element may further include an insulating layer formed on the substrate, wherein: the insulating layer may be provided with a contact hole; the variable resistance layer and the upper electrode may be formed only below an upper end of the contact hole; and the variable resistance layer may exist in an inner peripheral portion of the upper end in the contact hole whereas the upper electrode may not exist in this inner peripheral portion.

In this configuration, the amount of material used as the upper electrode can be minimized. Note that the above expression "on the substrate" includes a case where the other layer or material is disposed between the insulating layer and the substrate.

In the variable resistance element, a portion which is convex may be only one. The convex surface of the electrode may project such that a projection amount thereof toward the variable resistance layer continuously increases from a peripheral portion of the electrode to a central portion of the electrode. In a cross section taken along a thickness direction of the variable resistance layer, a boundary formed by the convex surface may be a bow-like curved shape. The convex surface may have a bowl shape.

In this configuration, it is possible to cause a current density to moderately concentrate on the central portion of the contact hole. Therefore, it is possible to further suppress the malfunctions of the variable resistance element.

In the variable resistance element, a diode may be formed on the substrate so as to be electrically connected to the lower electrode.

In this configuration, cross talk between memory cells reduces. Therefore, the current is prevented from flowing backward, thereby improving energy efficiency and accuracy of the operation of the memory.

In the variable resistance element, a field effect transistor may be formed on the substrate so as to be electrically connected to the lower electrode.

In this configuration, by actively turning on and off the transistor, the cross talk between the memory cells further surely reduces. Therefore, the current is prevented from flowing backward, thereby improving the energy efficiency and the accuracy of the operation of the memory.

Moreover, a semiconductor device of the present invention includes a nonvolatile memory portion in which a plurality of the variable resistance elements are formed in a matrix.

In this configuration, a nonvolatile memory can be formed by using the variable resistance element whose malfunctions are suppressed. Therefore, it is possible to suppress the malfunctions of the nonvolatile memory using the variable resistance element.

Moreover, a semiconductor device of the present invention may be formed by stacking nonvolatile memory portions, in each of which a plurality of the variable resistance elements are formed in a matrix.

In this configuration, by stacking the nonvolatile memories using the variable resistance elements whose malfunctions are suppressed, the improvement of the malfunctions and high integration can be realized at the same time.

Note that the above expression "formed to be convex" denotes a state of projecting, bulging, or rising.

The above object, other objects, features and advantages of the present invention will be made clear by the following detailed explanation of preferred embodiments with reference to the attached drawings.

Effects Of The Invention

The present invention has the above configuration, and has an effect of improving the malfunctions of the variable resistance element.

BRIEF DESCRIPTION OF THE DRAWINGS

FIG. 1($a$) is a schematic diagram showing a cross section parallel to a bit line, and FIG. 1($b$) is a schematic diagram showing a cross section parallel to a word line.

FIG. 2($a$) is a schematic diagram showing an upper surface, and FIG. 2($b$) is a schematic diagram showing a cross section taken along line X-X'.

FIG. 3($a$) is a schematic diagram showing an upper surface, and FIG. 3($b$) is a schematic diagram showing a cross section taken along line X-X'.

FIG. 4($a$) is a schematic diagram showing an upper surface, and FIG. 4($b$) is a schematic diagram showing a cross section taken along line X-X'.

FIG. 5($a$) is a schematic diagram showing an upper surface, and FIG. 5($b$) is a schematic diagram showing a cross section taken along line X-X'.

FIG. 6($a$) is a schematic diagram showing an upper surface, and FIG. 6($b$) is a schematic diagram showing a cross section taken along line X-X'.

FIG. 7($a$) is a schematic diagram showing an upper surface, and FIG. 7($b$) is a schematic diagram showing a cross section taken along line X-X'.

FIG. 8($a$) is a schematic diagram showing an upper surface, and FIG. 8($b$) is a schematic diagram showing a cross section taken along line X-X'.

FIG. 9($a$) is a schematic diagram showing an upper surface, and FIG. 9($b$) is a schematic diagram showing a cross section taken along line X-X'.

FIG. 11($a$) is a schematic diagram showing an upper surface, and FIG. 11($b$) is a schematic diagram showing a cross section taken along line X-X'.

FIG. 12($a$) is a schematic diagram showing an upper surface, and FIG. 12($b$) is a schematic diagram showing a cross section taken along line X-X'.

FIG. 13($a$) is a schematic diagram showing an upper surface, and FIG. 13($b$) is a schematic diagram showing a cross section taken along line X-X'.

FIG. 14($a$) is a schematic diagram showing an upper surface, and FIG. 14($b$) is a schematic diagram showing a cross section taken along line X-X'.

FIG. 15($a$) is a schematic diagram showing an upper surface, and FIG. 15($b$) is a schematic diagram showing a cross section taken along line X-X'.

FIG. 16($a$) is a schematic diagram showing an upper surface, and FIG. 16($b$) is a schematic diagram showing a cross section taken along line X-X'.

FIG. 17($a$) is a schematic diagram showing an upper surface, and FIG. 17($b$) is a schematic diagram showing a cross section taken along line X-X'.

FIG. 17(a) is a schematic diagram showing an upper surface, and FIG. 17(b) is a schematic diagram showing a cross section taken along line X-X'.

FIG. 20(a) is a schematic diagram showing an upper surface, and FIG. 20(b) is a schematic diagram showing a cross section taken along line X-X'.

FIG. 21(a) is a schematic diagram showing an upper surface, and FIG. 21(b) is a schematic diagram showing a cross section taken along line X-X'.

FIG. 22(a) is a schematic diagram showing an upper surface, and FIG. 22(b) is a schematic diagram showing a cross section taken along line X-X'.

FIG. 23(a) is a schematic diagram showing an upper surface, and FIG. 23(b) is a schematic diagram showing a cross section taken along line X-X'.

FIG. 24(a) is a schematic diagram showing an upper surface, and FIG. 24(b) is a schematic diagram showing a cross section taken along line X-X'.

FIG. 25(a) is a schematic diagram showing an upper surface, and FIG. 25(b) is a schematic diagram showing a cross section taken along line X-X'.

FIG. 26(a) is a schematic diagram showing an upper surface, and FIG. 26(b) is a schematic diagram showing a cross section taken along line X-X'.

FIG. 27(a) is a schematic diagram showing an upper surface, and FIG. 27(b) is a schematic diagram showing a cross section taken along line X-X'.

FIG. 28(a) is a schematic diagram showing an upper surface, and FIG. 28(b) is a schematic diagram showing a cross section taken along line X-X'.

FIG. 30(a) is a schematic diagram showing an upper surface, and FIG. 30(b) is a schematic diagram showing a cross section taken along line X-X'.

FIG. 31(a) is a schematic diagram showing an upper surface, and FIG. 31(b) is a schematic diagram showing a cross section taken along line X-X'.

FIG. 32(a) is a schematic diagram showing an upper surface, and FIG. 32(b) is a schematic diagram showing a cross section taken along line X-X'.

FIG. 33(a) is a schematic diagram showing an upper surface, and FIG. 33(b) is a schematic diagram showing a cross section taken along line X-X'.

FIG. 34(a) is a schematic diagram showing an upper surface, and FIG. 34(b) is a schematic diagram showing a cross section taken along line X-X'.

FIG. 35(a) is a schematic diagram showing an upper surface, and FIG. 35(b) is a schematic diagram showing a cross section taken along line X-X'.

FIG. 36(a) is a schematic diagram showing an upper surface, and FIG. 36(b) is a schematic diagram showing a cross section taken along line X-X'.

FIG. 37(a) is a schematic diagram showing a cross section parallel to the bit line, and FIG. 37(b) is a schematic diagram showing a cross section parallel to the word line.

FIG. 39(a) is a schematic diagram showing a cross section parallel to the bit line, and FIG. 39(b) is a schematic diagram showing a cross section parallel to the word line.

Figure 1:
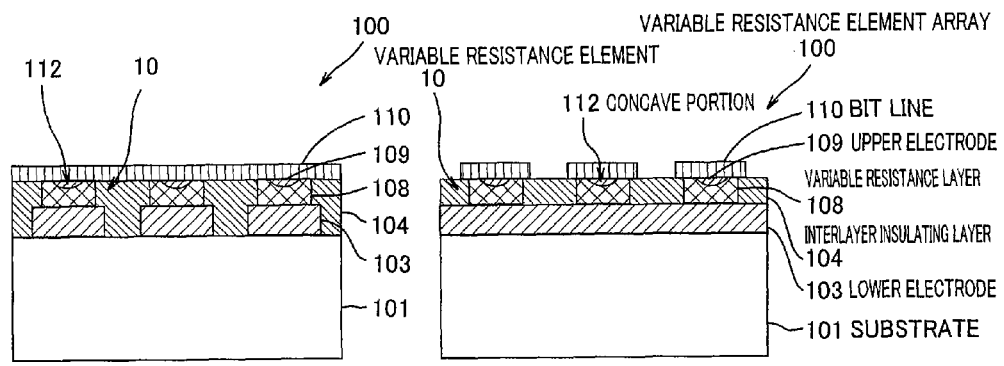
FIG. 1 are schematic diagrams showing one example of the configuration of a cross section of a variable resistance element of Embodiment 1 of the present invention.

EXPLANATION OF REFERENCE NUMBERS 10 variable resistance element
20 variable resistance element
21 substrate
22 interlayer insulating layer
23 $N^+$ region
24 $P^+$ region 25 barrier metal
26 lower electrode
27 PCMO memory material
28 upper electrode
30 variable resistance element
40 variable resistance element
50 variable resistance element
100 variable resistance element array
101 substrate
102 lower electrode film
103 lower electrode
104 interlayer insulating layer
105 contact hole
106 variable resistance material
107 upper electrode material
108 variable resistance layer
109 upper electrode
110 bit line
111 insulating layer
112 concave portion
200 variable resistance element array
201 substrate
202 silicon oxide layer
203 N$^+$ region
204 silicon oxide layer
205 contact hole
206 P$^+$ region
207 lower electrode
208 interlayer insulating layer
209 variable resistance layer
210 upper electrode
211 bit line
212 diode
213 concave portion
300 variable resistance element array
301 substrate
302 silicon oxide layer
303 opening
304 gate electrode
305 silicon oxide layer
306 N$^+$ region
307 opening
308 interlayer insulating layer
309 contact hole
310 lower electrode
311 variable resistance layer
312 upper electrode
313 gate conducting portion
314 source conducting portion
315A, 315B word line
316 plate line
317 insulating layer
318 bit line
319 concave portion
320 FET
321 FET
400 variable resistance element array
401 substrate
402 lower electrode film
403 lower electrode
404 interlayer insulating layer
405 contact hole
406 variable resistance material
407 variable resistance layer
408 bit line
500 variable resistance element array

BEST MODE FOR CARRYING OUT THE INVENTION

Hereinafter, preferred embodiments of the present invention will be explained in reference to the drawings.

Embodiment 1

Figure 10:
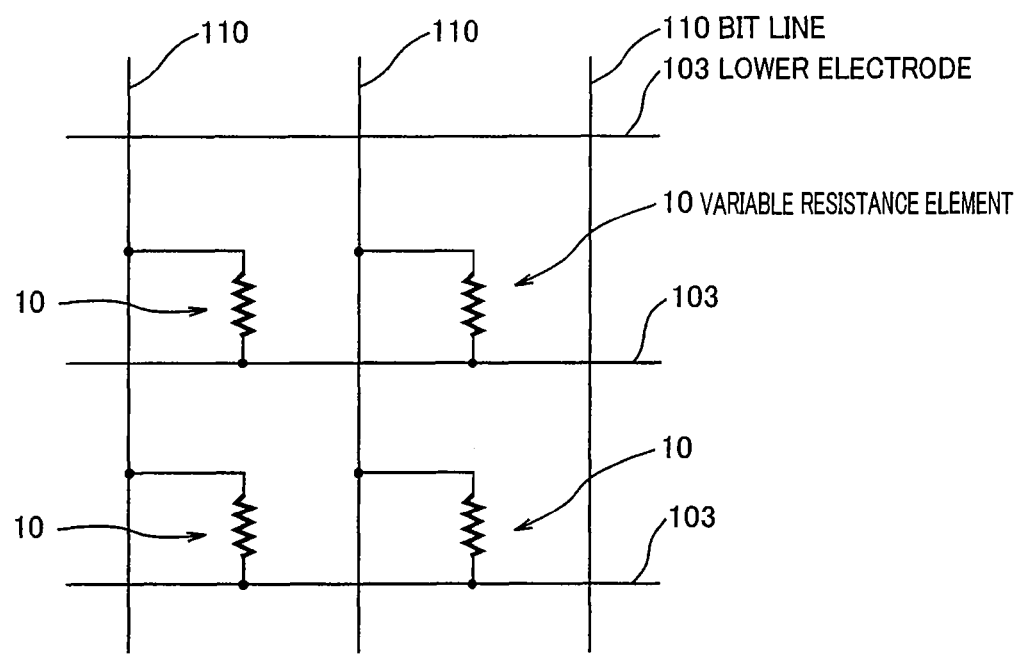
FIG. 10 is a circuit diagram showing an electrical equivalent circuit of a variable resistance element array of FIG. 1.

FIG. 1 are cross-sectional views showing one example of the configuration of a cross section of a variable resistance element of Embodiment 1 of the present invention. FIG. 1(a) is a cross-sectional view showing a cross section parallel to a bit line, and FIG. 1(b) is a cross-sectional view showing a cross section parallel to a word line. FIG. 10 is a circuit diagram showing an electrical equivalent circuit of a variable resistance element array of FIG. 1. Hereinafter, the configuration of a variable resistance element 10 of the present embodiment will be explained in reference to FIGS. 1 and 10.

As shown in FIGS. 1(a) and 1(b), a plurality of the variable resistance elements 10 according to the present embodiment are integrated to constitute a variable resistance element array 100. The variable resistance element array 100 includes a substrate 101. A plurality of band-shaped lower electrodes 103 are formed on the substrate 101 so as to be in parallel with each other with predetermined pitches. The lower electrode 103 also functions as a word line. A plurality of island-shaped variable resistance layers 108 are formed on each lower electrode 103 so as to be spaced apart from each other in a longitudinal direction of the lower electrode 103. A concave portion 112 is formed on an upper surface of each variable resistance layer 108. An upper electrode 109 is formed to fill in the concave portion 112. Moreover, an interlayer insulating layer 104 is formed to fill in gaps between the lower electrodes 103 and gaps between the variable resistance layers 108. An upper surface of the interlayer insulating layer 104, upper surfaces of the upper electrodes 109, and upper surfaces of the variable resistance layers 108 form a substantially flat surface. A plurality of band-shaped bit lines 110 are formed on this substantially flat surface. The bit lines 110 are formed to be in parallel with each other with predetermined pitches. In plan view, the bit lines 110 are formed to be orthogonal to the lower electrodes (word lines) 103, and the island-shaped variable resistance layers 108 are formed at respective intersection points of the bit lines 110 and the lower electrodes 103. In plan view, the variable resistance layer 108 is formed to have a substantially quadrangular shape, and an outer size (size) of the variable resistance layer 108 is smaller than the width of the bit line 110 and the width of the lower electrode 103. With this configuration, as shown in FIGS. 9 and 10, the variable resistance element array 100 (crosspoint memory array) is formed, in which the variable resistance elements 10 are formed in a matrix at respective intersection points of the lower electrodes (word lines) 103 extending in an a direction and the bit lines 110 extending in a b direction.

Used as the substrate 101 is a silicon substrate for example. The interlayer insulating layer 104 is made of, for example, silicon oxide, silicon nitride, silicon oxynitride, or the like. It is preferable that the thickness of the interlayer insulating layer 104 be 200 nm to 400 nm. The lower electrode 103, the upper electrode 109, and the bit line 110 are made of, for example, Pt, Ir, IrO$_x$, RuO$_x$ (x is 0 to 2), Cu, TiN, W, or the like. It is preferable that the thickness of the lower electrode 103 be 100 nm to 200 nm. It is preferable that the thickness of the bit line 110 be 100 nm to 200 nm. The width of the lower electrode 103 is about 1.2 µm for example, and the gap (space) between adjacent lower electrodes 103 is about 0.5 µm for example (the pitch is about 1.7 µm).

A material represented by Chemical Formula $A_xB_y$ (where A is one or a plurality of elements selected from the group consisting of Ni, Fe, Al, Hf, Zr, Ti, Ba, Sr, La, Si, and Y, and B is one or a plurality of elements selected from the group consisting of O, N, and F) can be used to form the variable resistance layer 108. Alternatively, a material represented by Chemical Formula $A_xA'_{1-x}B_yO_z$ (where A is one or a plurality of elements selected from the group consisting of La, Ce, Bi, Pr, Nd, Pm, Sm, Y, Sc, Yb, Lu, and Gd, A' is one or a plurality of elements selected from the group consisting of Mg, Ca, Sr, Ba, Pb, Zn, and Cd, B is one or a plurality of elements selected from the group consisting of Mn, V, Fe, Co, Nb, Cr, Mo, W, Zr, Hf, and Ni, x is 0 to 1, y is 0 to 2, and z is 1 to 7) may be used to form the variable resistance layer 108. A preferable thickness of the variable resistance layer 108 is 100 nm to 200 nm. Each of the width and length of the variable resistance layer 108 is about 0.8 µm for example.

Figure 2:
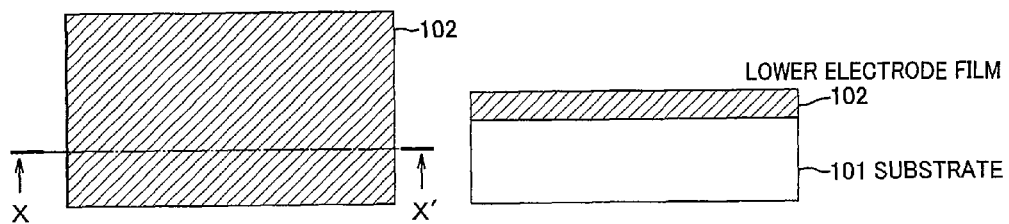
FIG. 2 are diagrams showing a step of forming a lower electrode film on a substrate, in a method for manufacturing the variable resistance element in Embodiment 1 of the present invention.
Figure 3:
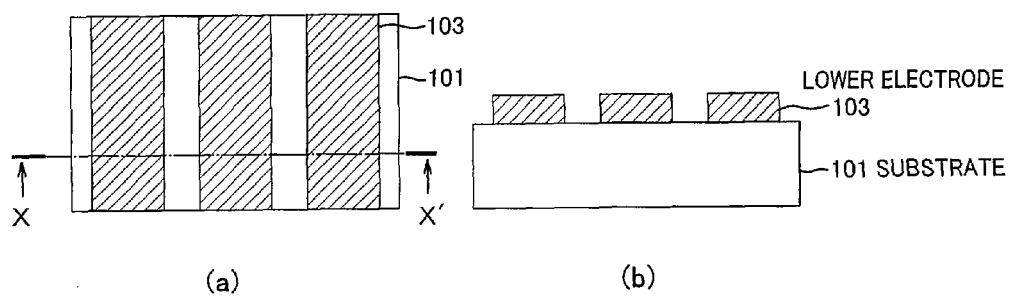
FIG. 3 are diagrams showing a step of forming lower electrodes, in the method for manufacturing the variable resistance element in Embodiment 1 of the present invention.
Figure 4:
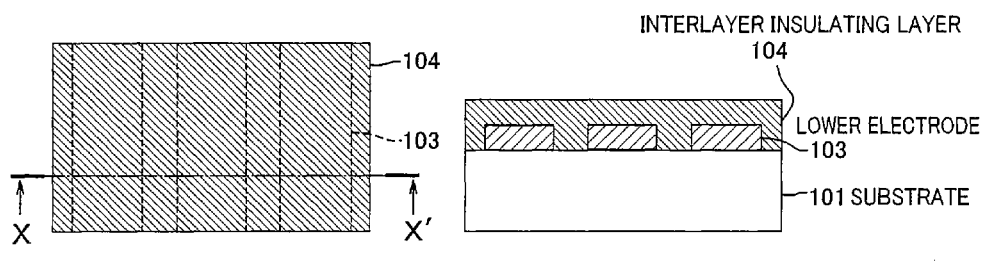
FIG. 4 are diagrams showing a step of forming an interlayer insulating layer, in the method for manufacturing the variable resistance element in Embodiment 1 of the present invention.
Figure 5:
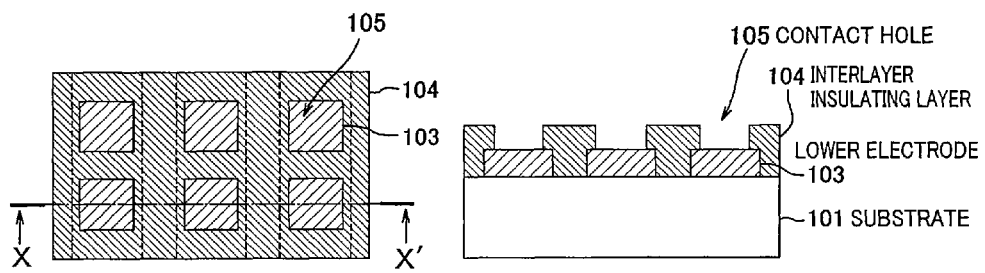
FIG. 5 are diagrams showing a step of forming contact holes, in the method for manufacturing the variable resistance element in Embodiment 1 of the present invention.
Figure 6:
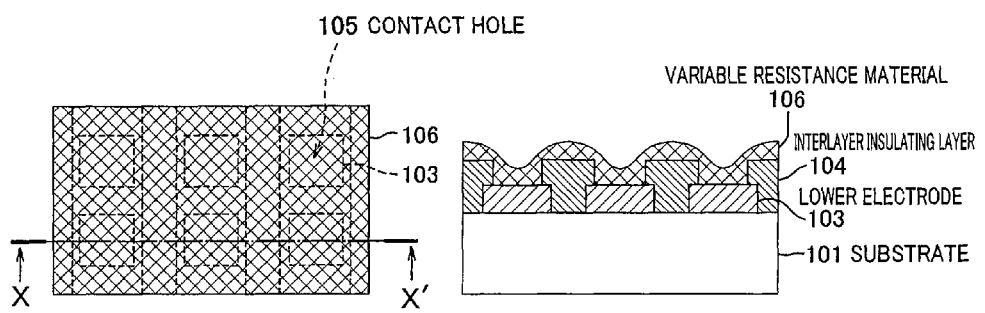
FIG. 6 are diagrams showing a step of depositing a variable resistance material, in the method for manufacturing the variable resistance element in Embodiment 1 of the present invention.
Figure 7:
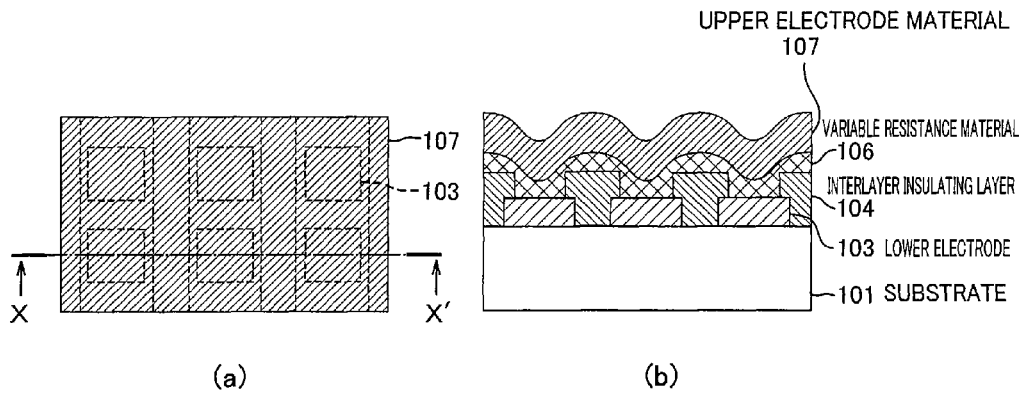
FIG. 7 are diagrams showing a step of depositing an upper electrode material, in the method for manufacturing the variable resistance element in Embodiment 1 of the present invention.
Figure 8:
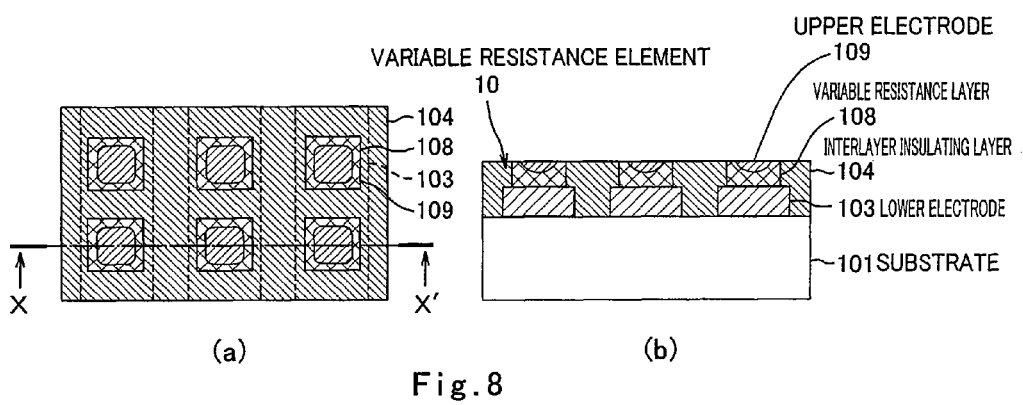
FIG. 8 are diagrams showing a step of element-isolating the variable resistance elements, in the method for manufacturing the variable resistance element in Embodiment 1 of the present invention.
Figure 9:
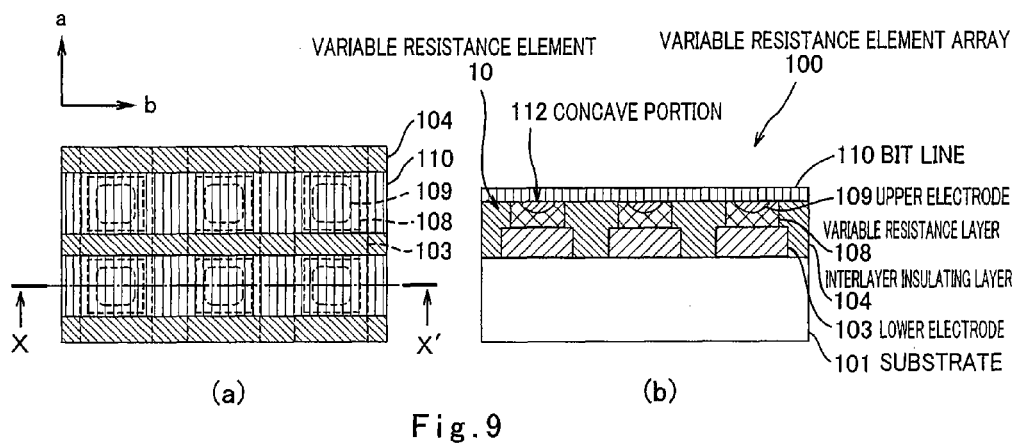
FIG. 9 are diagrams showing a step of forming bit lines, in the method for manufacturing the variable resistance element in Embodiment 1 of the present invention.

FIGS. 2 to 9 are diagrams showing respective steps of the method for manufacturing the variable resistance element in Embodiment 1 of the present invention. Each of FIGS. 2(a) to 9(a) is a schematic diagram showing an upper surface, and each of FIGS. 2(b) to 9(b) is a schematic diagram showing a cross section taken along line X-X' of each of FIGS. 2(a) to 9(a). FIG. 2 are diagrams showing a step of forming a lower electrode film on the substrate. FIG. 3 are diagrams showing a step of forming the lower electrodes. FIG. 4 are diagrams showing a step of forming the interlayer insulating layer. FIG. 5 are diagrams showing a step of forming the contact holes. FIG. 6 are diagrams showing a step of depositing a variable resistance material. FIG. 7 are diagrams showing a step of depositing an upper electrode material. FIG. 8 are diagrams showing a step of element-isolating the variable resistance elements. FIG. 9 are diagrams showing a step of forming the bit lines. Hereinafter, the method for manufacturing the variable resistance element 10 in Embodiment 1 of the present invention will be explained in reference to FIGS. 2 to 9.

In the method for manufacturing the variable resistance element 10 in Embodiment 1 of the present invention, first, a lower electrode film 102 is deposited on the substrate 101 by sputtering, CVD, or the like (step of FIG. 2). Next, the lower electrode film 102 is subjected to patterning and etching, and thereby the lower electrodes 103 each having a predetermined width are formed to be in parallel with each other with predetermined pitches (step of FIG. 3). Next, the interlayer insulating layer 104 made of silicon oxide or silicon nitride is formed on the lower electrodes 103 (step of FIG. 4). Next, the interlayer insulating layer 104 is subjected to patterning and etching, thereby forming contact holes 105, each of which reaches the lower electrode 103 (step of FIG. 5). Next, the variable resistance material is deposited by MOD or MOCVD to fill in the contact holes 105 and cover the interlayer insulating layer 104, thereby forming a variable resistance material film 106 (step of FIG. 6). At this time, the amount of deposition of the variable resistance material is controlled such that the variable resistance material film 106 in the contact hole 105 is lower in height than the upper surface of the interlayer insulating layer 104. Since the height (distance from the substrate 101; the same is true in the following explanation) of the surface on which the variable resistance material is deposited is different between portions of the contact holes 105 and the other portions, the height of the surface of the deposited variable resistance material is also different depending on the portions. The height of the upper surface of the variable resistance material film 106 is low in the contact holes 105 and high around the contact holes 105. At this time, the upper surface of the variable resistance material film 106 at a lowest portion in the contact hole 105 is lower in height than the upper surface of the interlayer insulating layer 104 around the contact hole 105. Next, the upper electrode material is deposited on the variable resistance material film 106 by sputtering, CVD, or the like to form an upper electrode material film 107 (step of FIG. 7). At this time, the amount of deposition of the upper electrode material is controlled such that the upper surface of the upper electrode material film 107 in the contact hole 105 is higher in height than the upper surface of the interlayer insulating layer 104. It is preferable that the thickness of the upper electrode material film 107 be 200 nm or more. Since the height of the surface on which the upper electrode material is deposited is different between the portions of the contact holes 105 and the other portions, the height of the upper surface of the deposited upper electrode material film 107 is also different depending on the portions. The height of the upper surface of the upper electrode material film 107 is low in the contact holes 105 and high around the contact holes 105. At this time, the upper surface of the variable resistance material film 106 at the lowest portion in the contact hole 105 is higher in height than the upper surface of the interlayer insulating layer 104 around the contact hole 105. Next, the variable resistance material film 106 and the upper electrode material film 107 are smoothed by a CMP, thereby element-isolating the variable resistance elements 10 (step of FIG. 8). In each variable resistance element 10, the variable resistance layer 108 and the upper electrode 109 are formed. Moreover, the upper surface of the interlayer insulating layer 104, the upper surfaces of the variable resistance layers 108, and the upper surfaces of the upper electrodes 109 form the substantially flat surface. Next, the bit lines 110 each having a predetermined width are formed on this substantially flat surface so as to extend in a direction orthogonal to the lower electrodes 103, cover (be electrically connected to) the upper electrodes 109, and be in parallel with each other with predetermined pitches, thereby forming the variable resistance element array 100 of FIGS. 1(a) and 1(b) (step of FIG. 9).

Next, the operation of the variable resistance element 10 configured and manufactured as above will be explained based on FIGS. 1 and 10. A writing operation with respect to the variable resistance element 10 is carried out in the following manner. In a case where each of the upper electrodes 109 and the lower electrodes 103 is 1.6 µm long and 1.6 µm wide, the upper electrode 109 has a thickness of 100 nm, the lower electrode has a thickness of 200 nm, and the variable resistance layer 108 (FeO film) has a thickness of 100 nm, one example is that a positive voltage pulse applied between the upper electrode 109 and the lower electrode 103 is 1.7 V, a negative voltage pulse applied therebetween is 1.8 V, and a duration of the voltage pulse applied therebetween is 100 nanoseconds. For example, the resistance value becomes about 1 MΩ by the application of the negative voltage pulse, and the resistance value becomes about 1 kΩ by the application of the positive voltage pulse. Therefore, digital data can be written by applying "the negative voltage pulse" and "the positive voltage pulse" in accordance with "1" and "0" of the bits of the digital data. Herein, "positive" means that the upper electrode 109 is positive with respect to the lower electrode 103. The lower electrode 103 is grounded, and the upper electrode 109 is positive or negative.

A readout operation of the digital data stored in the variable resistance element 10 is carried out by supplying a constant current between the upper electrode 109 and the lower electrode 103 and detecting a voltage generated between the upper electrode 109 and the lower electrode 103. For example, the constant current of 150 μA (0.15 mA) is supplied, and the voltage is measured. The detected voltage is caused to correspond to "1" or "0" of the bit, thereby reading out the stored digital data.

A feature of the variable resistance element 10 of the present embodiment is that a lower surface of the upper electrode 109 is formed to have a convex shape (to curve downwardly). More specifically, the upper electrode 109 bulges toward the variable resistance layer 108 at a center portion thereof (center portion of the cross section parallel to the substrate 101; the same is true in the following explanations) as compared to at a peripheral portion thereof (peripheral portion of the cross section parallel to the substrate 101; the same is true in the following explanations). Further specifically, in the present embodiment, the variable resistance layer 108 and the upper electrode 109 are sequentially stacked in the hole (contact hole 105 in FIG. 5) formed on the interlayer insulating layer 104. Reflecting this manufacturing method, in the present invention, the number of the concave portions 112 (or the number of concave portions on the upper electrode) is one in principle for each variable resistance element 10. Moreover, the depth of the concave portion 112 (the difference in height between the upper end surface of the variable resistance layer 108 forming the concave portion 112 and the upper end surface of the interlayer insulating layer 104) continuously increases from a peripheral portion of the hole to a central portion of the hole, is the largest at the central portion, and is the smallest at the peripheral portion. In other words, the thickness (projection amount) of the upper electrode 109 projecting toward the variable resistance layer 108 continuously increases from the peripheral portion of the hole to the central portion of the hole, is the largest at the central portion, and the smallest in the peripheral portion. Further in other words, a contact surface between the upper electrode 109 and the variable resistance layer 108 has a bowl shape. When viewed in a cross section in a thickness direction of the variable resistance layer, a boundary that is the contact surface between the variable resistance layer 108 and the upper electrode 109 is typically a bow-like curved shape.

With this configuration, the distance between the lower electrode 103 and the upper electrode 109 is shorter at the central portion than at the peripheral portion. In this configuration, a resistance between these electrodes is lower at the central portion. In a case where a potential difference is applied between these electrodes, an electric field becomes stronger at the central portion, and the current concentrates on the central portion. Moreover, the peripheral portion of the variable resistance layer 108 tends to deteriorate due to etching and the like. In the configuration of the present embodiment, since the electric field and the current concentrate on the central portion, the variable resistance element is less affected by the deterioration of the variable resistance material of the peripheral portion of the variable resistance layer 108, thereby improving operation stability and reliability. That is, it is possible to suppress malfunctions of the variable resistance element caused due to the deterioration of the variable resistance material which occurs in manufacturing steps. Specifically, in the case of using the variable resistance element for a long period of time, a difference between a low resistance value and a high resistance value gradually decreases, and disappears in the end. However, in accordance with the variable resistance element of the present embodiment, since the variable resistance material is prevented from deteriorating, the number of times the resistance is changed increases, thereby obtaining effects, such as extending the life.

Moreover, since the depth of the concave portion 112 or the thickness of the upper electrode 109 continuously changes, the current does not concentrate on one point, and moderately concentrates within a certain range. To be specific, a current density becomes high at the central portion, and the current density continuously decreases from the central portion to the peripheral portion. With this configuration, loads applied to the variable resistance layer 108 by the writing operation are distributed, and the deterioration of the variable resistance layer 108 by the writing operation hardly concentrates on a specific portion. Therefore, even if a large number of the writing operations are carried out, the malfunctions caused due to the deterioration of the variable resistance layer 108 hardly occurs.

A feature of the method for manufacturing the variable resistance element in the present embodiment is that the variable resistance material film 106 is deposited to fill in the contact holes 105, and the upper electrode material film 107 is directly deposited on the variable resistance material film 106 before carrying out smoothing by the CMP or the like. Moreover, another feature of the method for manufacturing the variable resistance element in the present embodiment is that by controlling the amounts of deposition in steps of depositing the variable resistance material and the upper electrode material, a lowest portion of an interface between the variable resistance material film 106 and the upper electrode material film 107 is lower in height than the upper surface of the interlayer insulating layer 104.

The variable resistance material is sensitive to the oxidation-reduction reaction, i.e., the variable resistance material is easily oxidized and reduced, thereby deteriorating the property of the variable resistance material. In the case of iron as an example, the variable resistance material mainly contains $Fe_3O_4$, and further contains $Fe_2O_3$, FeO, and the like. In a case where $Fe_3O_4$ reacts by temperatures or ambient atmosphere, and $Fe_2O_3$ or FeO changes in amount, the variable resistance element loses its operation stability and lowers its reliability.

In accordance with the manufacturing method of the present embodiment, since the surface of deposition is varied in height depending on the shape of the contact hole 105, the concave portion 112 is formed on the upper surface of the variable resistance layer 108 as a consequence, and the upper electrode 109 is formed to fill in the concave portion 112. With this configuration, the variable resistance element 10 is less affected by the peripheral portion which deteriorates easily. Moreover, even if the smoothing is carried out by the CMP until reaching the interlayer insulating layer 104 for element isolation, the upper electrode 109 remains in the contact hole 105. Therefore, the interface between the variable resistance layer 108 and the upper electrode 109 does not deteriorate due to the CMP, and thus the variable resistance element 10 can be manufactured while maintaining the variable resistance layer 108 in a satisfactory state.

Embodiment 2

The variable resistance element of Embodiment 2 of the present invention is formed by electrically connecting a diode to the lower electrode of the variable resistance element 10 of Embodiment 1. Therefore, the variable resistance element of Embodiment 2 of the present invention is the same as the variable resistance element 10 except for the lower electrode and the diode. On this account, same names are used for common components between the variable resistance element of Embodiment 1 and the variable resistance element of Embodiment 2, and explanations of those components are omitted.

Figure 18:
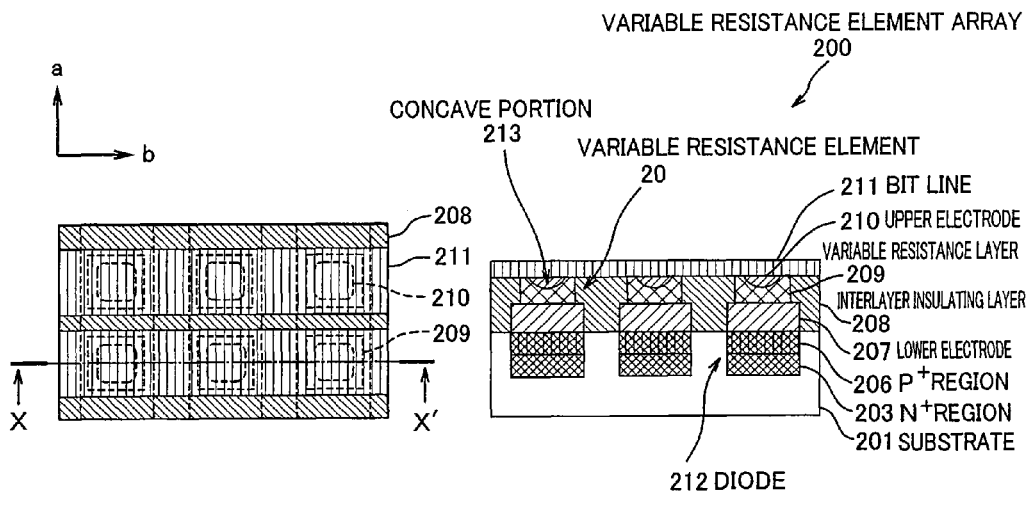
FIG. 18 are diagrams showing a step of forming variable resistance layers 209, upper electrodes 210, and bit lines 211 on the lower electrodes 207, in the method for manufacturing the variable resistance element in Embodiment 2 of the present invention.
Figure 19:
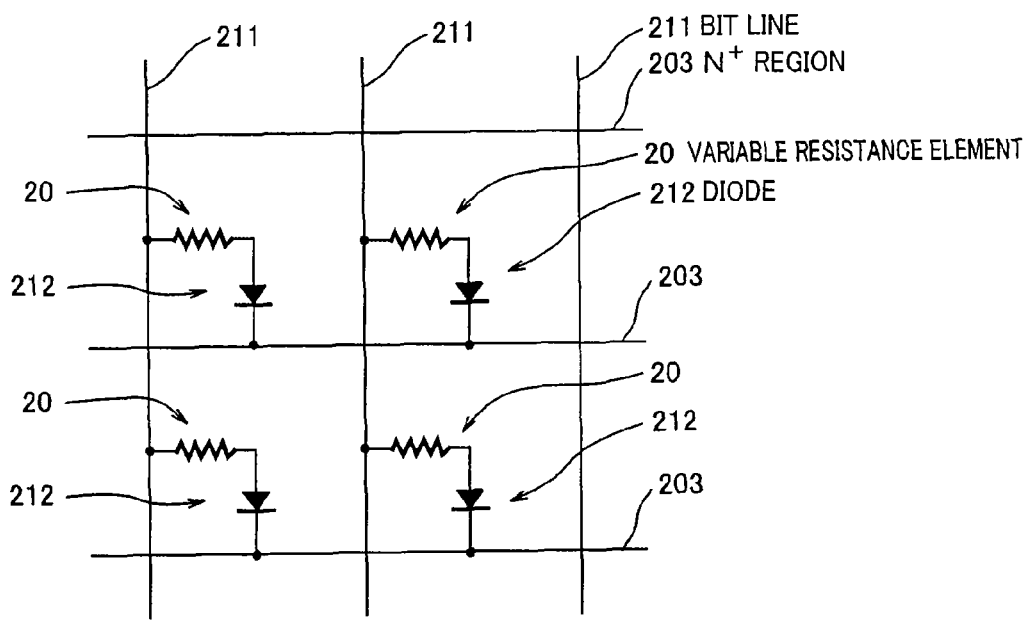
FIG. 19 is a circuit diagram showing an electrical equivalent circuit of the variable resistance element array of FIG. 18.

FIG. 18 are schematic diagrams showing one example of the configuration of the variable resistance element of Embodiment 2 of the present invention. FIG. 18(a) is a top view, and FIG. 18(b) is a cross-sectional view taken along line x-x' of FIG. 18(a). FIG. 19 is a circuit diagram showing an electrical equivalent circuit of the variable resistance element array of FIG. 18. Hereinafter, the configuration of a variable resistance element 20 of the present embodiment will be explained in reference to FIGS. 18 and 19.

As shown in FIGS. 18(a) and 18(b), a plurality of the variable resistance elements 20 according to the present embodiment are integrated to constitute a variable resistance element array 200. The variable resistance element array 200 includes a substrate 201. A plurality of N$^+$ regions 203, each having a band shape in plan view and a predetermined depth from the surface of the substrate 201, are formed on the substrate 201 so as to be in parallel with each other with predetermined pitches. A plurality of well-type P$^+$ regions 206 are formed on each N$^+$ region 203 so as to be spaced apart from each other in a longitudinal direction of the N$^+$ region 203. The P$^+$ region 206 is formed to have a predetermined depth from the surface of the N$^+$ region 203. In the present embodiment, the N$^+$ region 203 constitutes the word line. A lower electrode 207 having substantially the same width and length as the P$^+$ region 206 is formed on the P$^+$ region 206. An element formed of a variable resistance layer 209 and an upper electrode 210 is formed on the lower electrode 207. A concave portion 213 is formed on the upper surface of the variable resistance layer 209. The upper electrode 210 is formed to fill in the concave portion 213. An interlayer insulating layer 208 is formed to fill in spaces between the lower electrodes 207 and spaces between the variable resistance layers 209. An upper surface of the interlayer insulating layer 208, upper surfaces of the variable resistance layers 209, and upper surfaces of the upper electrodes 210 form a substantially flat surface. A plurality of band-shaped bit lines 211 are formed on this substantially flat surface. The bit lines 211 are formed to be in parallel with each other with predetermined pitches. In plan view, the bit lines 211 are formed to be orthogonal to the N$^+$ regions 203 (word lines), and the P$^+$ regions 206, the lower electrodes 207, and the variable resistance layers 209 are formed at respective intersection points of the bit lines 211 and the N$^+$ regions 203 (word lines). In plan view, each of the P$^+$ regions 206, the lower electrodes 207, and the variable resistance layers 209 is formed to have a substantially quadrangular shape, and an outer size (size) of each of the P$^+$ regions 206, the lower electrodes 207, and the variable resistance layers 209 is smaller than the width of the bit line 211 and the width of the N$^+$ region 203 (word line). With this configuration, as shown in FIGS. 18 and 19, the variable resistance element array 200 (crosspoint memory array) is formed, in which the variable resistance elements 20 (memory cells) and PN junction diodes 212 are formed in a matrix at respective intersection points of the N$^+$ regions 203 (word lines) extending in the a direction and the bit lines 211 extending in the b direction.

The N$^+$ region 203 can be obtained by, for example, implanting P ions in a silicon substrate. The thickness (depth) of the N$^+$ region 203 is about 100 μm for example. The width of the N$^+$ region 203 is about 1.2 μm for example. The gap (space) between adjacent N$^+$ regions 203 is about 0.5 μm for example. The P$^+$ region 206 can be obtained by, for example, implanting a BF$_2$ ion in a silicon substrate. The thickness (depth) of the P$^+$ region 206 is about 100 μm for example.

Figure 11:
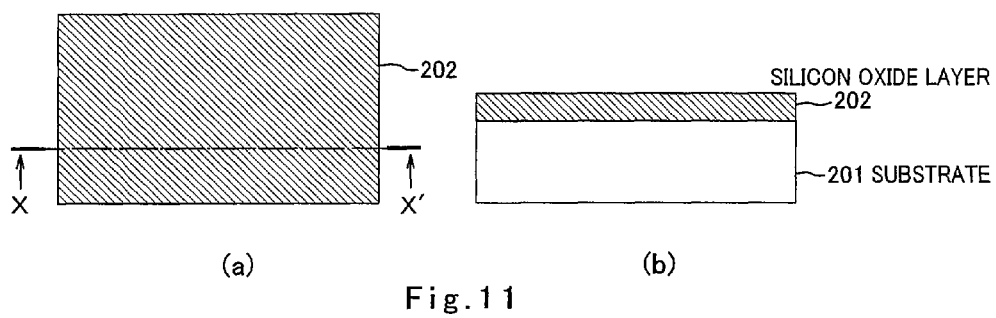
FIG. 11 are diagrams showing a step of forming a silicon oxide layer on a substrate, in the method for manufacturing the variable resistance element in Embodiment 2 of the present invention.
Figure 12:
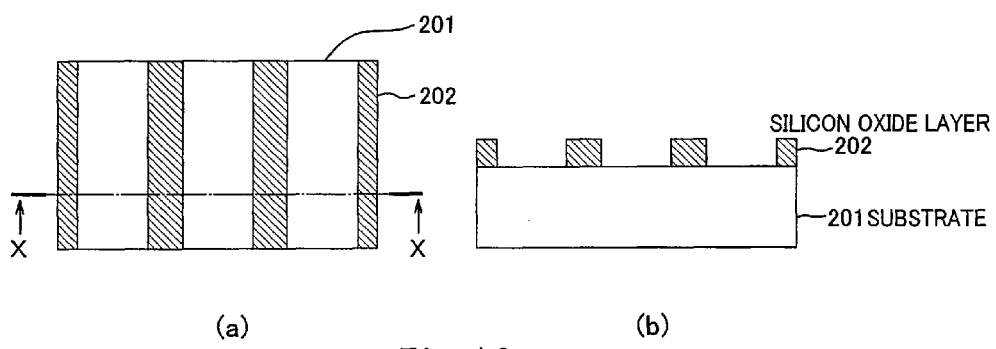
FIG. 12 are diagrams showing a step of etching the silicon oxide layer, in the method for manufacturing the variable resistance element in Embodiment 2 of the present invention.
Figure 13:
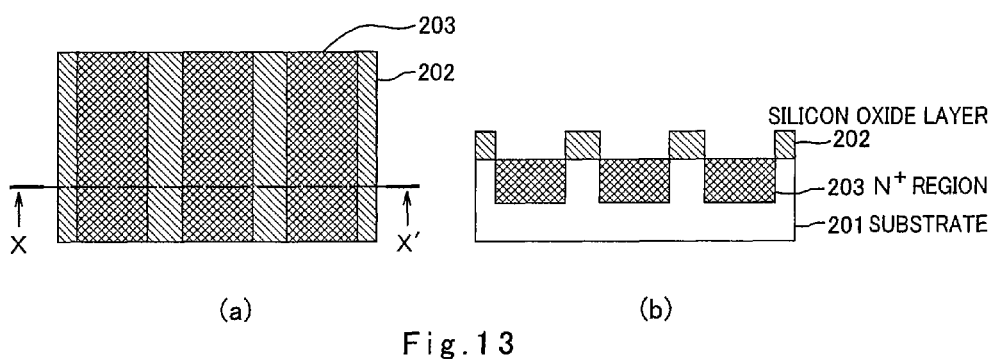
FIG. 13 are diagrams showing a step of forming $N^+$ regions by an ion implantation, in the method for manufacturing the variable resistance element in Embodiment 2 of the present invention.
Figure 14:
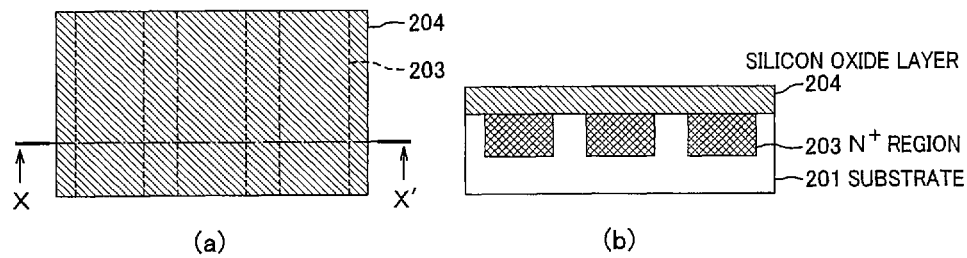
FIG. 14 are diagrams showing a step of forming the silicon oxide layer over the $N^+$ regions, in the method for manufacturing the variable resistance element in Embodiment 2 of the present invention.
Figure 15:
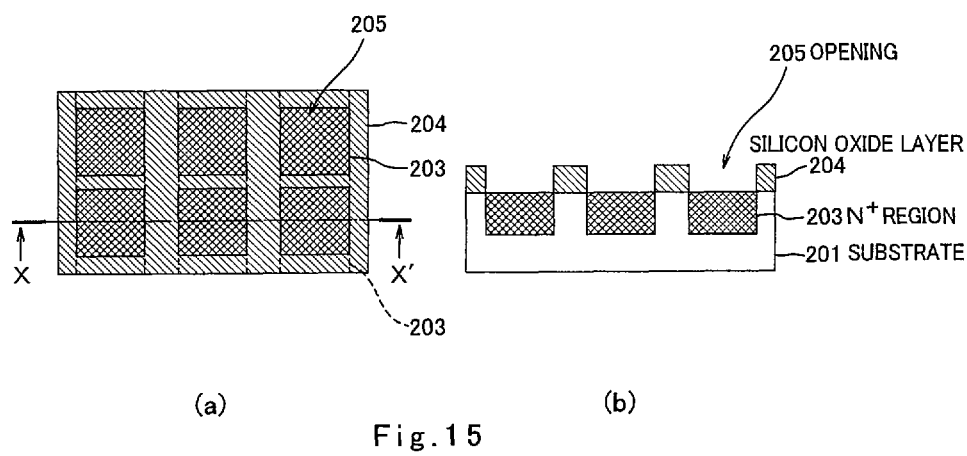
FIG. 15 are diagrams showing a step of forming openings to form therein $P^+$ regions, in the method for manufacturing the variable resistance element in Embodiment 2 of the present invention.
Figure 16:
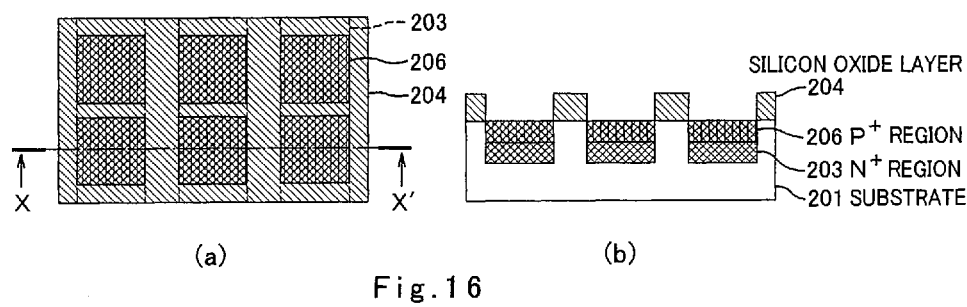
FIG. 16 are diagrams showing a step of forming the $P^+$ regions by the ion implantation, in the method for manufacturing the variable resistance element in Embodiment 2 of the present invention.
Figure 17:
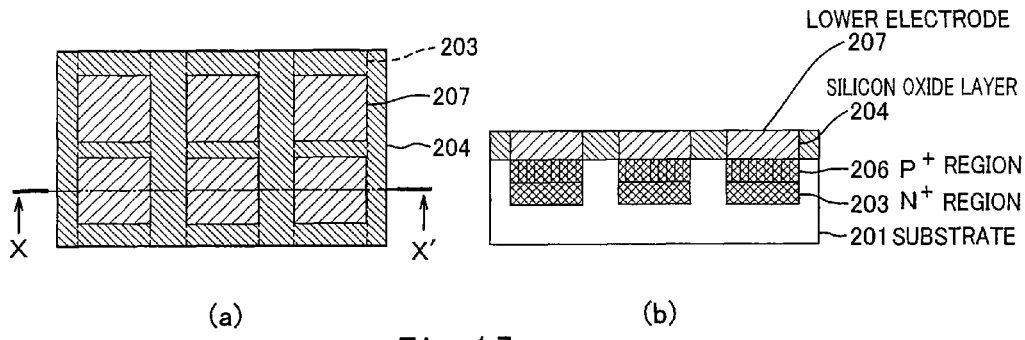
FIG. 17 are diagrams showing a step of forming lower electrodes 207, in the method for manufacturing the variable resistance element in Embodiment 2 of the present invention.

FIGS. 11 to 18 are diagrams showing respective steps of the method for manufacturing the variable resistance element array 200 in Embodiment 2 of the present invention. Each of FIGS. 11(a) to 18(a) is a schematic diagram showing an upper surface, and each of FIGS. 11(b) to 18(b) is a schematic diagram showing a cross section taken along line X-X' of each of FIGS. 11(a) to 18(a). FIG. 11 are showing a step of forming a silicon oxide layer on a substrate. FIG. 12 are diagrams showing a step of etching the silicon oxide layer. FIG. 13 are diagrams showing a step of forming the N$^+$ regions by ion implantation. FIG. 14 are diagrams showing a step of forming the silicon oxide layer over the N$^+$ regions. FIG. 15 are diagrams showing a step of forming openings to form therein the P$^+$ regions. FIG. 16 are diagrams showing a step of forming the P$^+$ regions by the ion implantation. FIG. 17 are diagrams showing a step of forming the lower electrodes 207. FIG. 18 are diagrams showing a step of forming the variable resistance layers 209, the upper electrodes 210, and the bit lines 211 on the lower electrodes 207. Hereinafter, the method for manufacturing the variable resistance element 20 in Embodiment 2 of the present invention will be explained in reference to FIGS. 11 to 18.

In the method for manufacturing the variable resistance element 20 in Embodiment 2 of the present invention, first, a silicon oxide layer 202 is deposited on the substrate 201 (step of FIG. 11). Next, the silicon oxide layer 202 is subjected to patterning and etching, and thereby grooves 212 each having a predetermined width are formed to be in parallel with each other with predetermined pitches (step of FIG. 12). Next, the P ion is implanted using the silicon oxide layers 202 as masks, thereby forming the N$^+$ region 203 having a predetermined depth at a lower portion of the groove 212 (step of FIG. 13). Next, the silicon oxide layers 202 are removed, and a silicon oxide layer 204 is newly deposited (step of FIG. 14). Next, the silicon oxide layer 204 is subjected to patterning and etching using lithography, thereby forming openings 205 on the N$^+$ regions 203 at predetermined intervals (step of FIG. 15). Next, a BF$_2$ ion is implanted using the silicon oxide layer 204 as a mask, thereby forming well-type P$^+$ regions 206 on the N$^+$ regions 203 at predetermined intervals (step of FIG. 16). Next, the lower electrodes 207 are formed by sputtering and the CMP to fill in the openings 205 (step of FIG. 17). Next, the variable resistance layer 209, the upper electrode 210, the bit line 211, and the interlayer insulating film 208 are formed on the lower electrode 207, thereby forming the variable resistance element array 200 (step of FIG. 18). Since the step of FIG. 18 is the same as the step of Embodiment 1, a detailed explanation thereof is omitted.

Since the operations (the writing operation and the readout operation) of the variable resistance element 20 of the present embodiment are the same as those of Embodiment 1, explanations thereof are omitted.

The variable resistance element 20 of the present embodiment has the same features and effects as the variable resistance element 10 of Embodiment 1. Further, in the variable resistance element 20, a PN junction diode 212 formed of the P$^+$ region 206 and the N$^+$ region 203 is disposed under the lower electrode 207, and the N$^+$ region 203 functions as the word line. With this configuration, cross talk between memory cells decreases. To be specific, in the variable resistance element 10 of Embodiment 1, current may flow through adjacent memory cells depending on the configuration of the memory cell and the applied voltage or current. If the current flows through an unintended path, the power consumption may increase due to excess current, and the voltage pulse of a desired magnitude may not be applied to a target memory cell for a desired period of time. In contrast, since the variable resistance element 20 of the present embodiment includes the diode 212, the current is prevented from flowing backward, thereby improving the energy efficiency and the accuracy of the operation of the memory at the same time.

Moreover, the method for manufacturing the variable resistance element in the present embodiment has the same features as that in Embodiment 1. Further, in accordance with the manufacturing method of the present embodiment, the crosspoint memory array in which the PN junction diode is electrically connected to the lower electrode can be manufactured.

Embodiment 3

The variable resistance element of Embodiment 3 of the present invention is formed by electrically connecting an FET (field effect transistor) to the lower electrode of the variable resistance element 10 of Embodiment 1. Therefore, the variable resistance element of Embodiment 3 of the present invention is the same as the variable resistance element 10 except for the lower electrode and the FET. On this account, same names are used for common components between the variable resistance element of Embodiment 1 and the variable resistance element of Embodiment 3, and explanations of those components are omitted.

Figure 28:
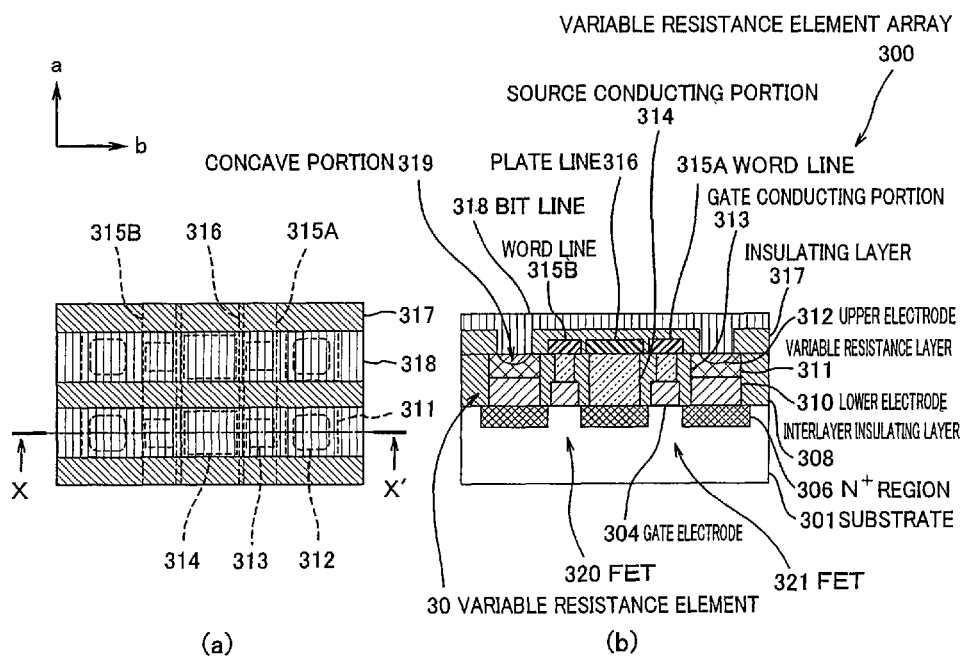
FIG. 28 are diagrams showing a step of forming word lines, bit lines, and plate lines, in the method for manufacturing the variable resistance element in Embodiment 3 of the present invention.
Figure 29:
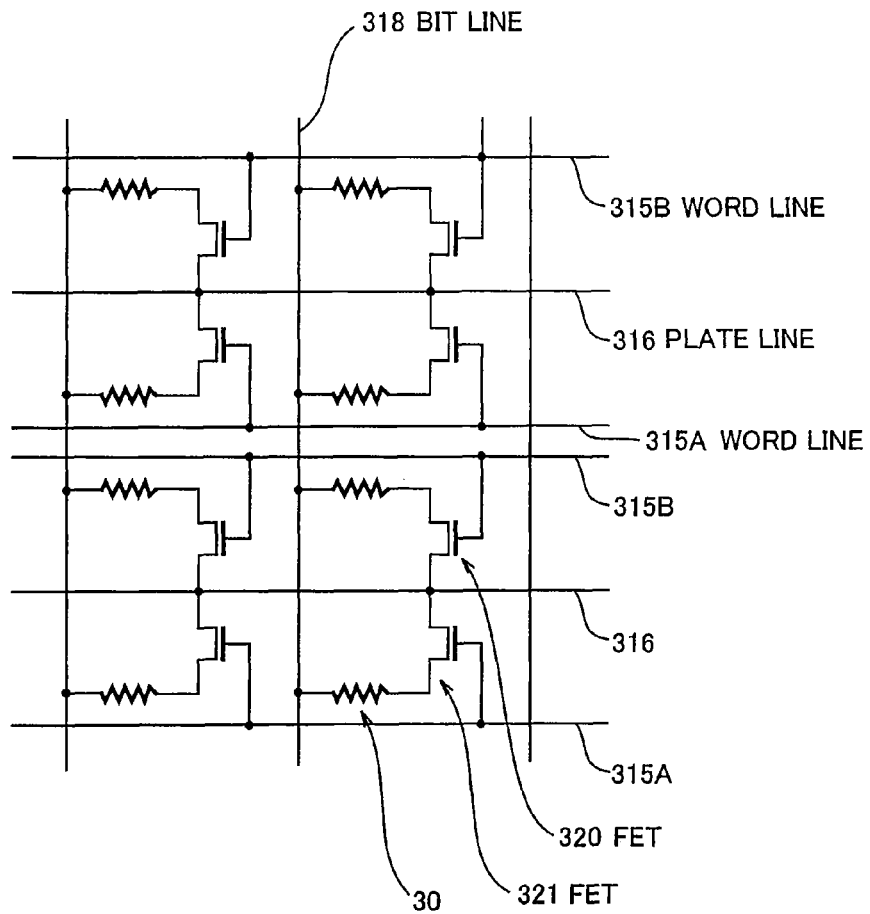
FIG. 29 is a circuit diagram showing an electrical equivalent circuit of the variable resistance element array of FIG. 28.

FIG. 28 are schematic diagrams showing one example of the configuration of the variable resistance element of Embodiment 3 of the present invention. FIG. 28(*a*) is a top view, and FIG. 28(*b*) is a cross-sectional view taken along line x-x' of FIG. 28(*a*). FIG. 29 is a circuit diagram showing an electrical equivalent circuit of the variable resistance element array of FIG. 28. Hereinafter, the configuration of a variable resistance element 30 of the present embodiment will be explained in reference to FIGS. 28 and 29.

As shown in FIGS. 28(*a*) and 28(*b*), a plurality of the variable resistance elements 30 according to the present embodiment are integrated to constitute a variable resistance element array 300. The variable resistance element array 300 includes a substrate 301. A plurality of well-type N$^+$ regions 306 are formed on the substrate 301 at predetermined intervals in a matrix in which the a direction is a column direction and the b direction is a row direction. In plan view, the shape of the N$^+$ region 306 is a square for example. On the basis that the N$^+$ regions 306 arranged in a matrix form three columns each extending in the a direction, island-shaped gate electrodes 304 form two columns so as to be sandwiched between adjacent columns of the N$^+$ regions 306. In plan view, the shape of the gate electrode 304 is a square for example. With this configuration, the variable resistance element array 300 includes two gate electrodes 304 for every three N$^+$ regions 306. The gate electrodes 304 and the substrate 301 are insulated from each other by an insulating layer, not shown. A prismatic-shape gate conducting portion 313 is formed on the gate electrode 304. A prismatic-shape source conducting portion 314 is formed on each of the N$^+$ regions 306 corresponding to the center column of the three columns of the N$^+$ regions 306. The variable resistance element 30 formed by stacking a lower electrode 310, a variable resistance layer 311, and an upper electrode 312 in this order is formed on each of the N$^+$ regions 306 located on both sides of the source conducting portion 314. A concave portion 319 is formed on the upper surface of the variable resistance layer 311. The upper electrode 312 is formed to fill in the concave portion 319. An interlayer insulating layer 308 is formed to fill in spaces among the variable resistance element 30, the gate conducting portion 313, and the source conducting portion 314. An upper surface of the interlayer insulating layer 308, upper surfaces of the variable resistance layers 311, upper surfaces of the upper electrodes 312, upper surfaces of the gate conducting portions 313, and upper surfaces of the source conducting portions 314 form a substantially flat surface. A plurality of band-shaped plate lines 316, word lines 315A, and word lines 315B are formed on the substantially flat surface to be in parallel with each other with predetermined pitches. An insulating layer 317 is formed to fill in spaces between the plate line 316 and the word line 315A and between the plate line 316 and the word line 315B and cover the plate line 316, the word line 315A, and the word line 315B. A plurality of band-shaped bit lines 318 are formed on the insulating layer 317 to be in parallel with each other with predetermined pitches. The bit line 318 extends directly above the upper electrode 312, and is electrically connected to the upper electrode 312 via an electric conducting portion disposed to penetrate through the insulating layer 317. In plan view, the bit line 318 extending in the b direction and the plate line 316 extending in the a direction are formed to be orthogonal to each other. In plan view, each of the lower electrodes 310, the variable resistance layers 311, and the source conducting portions 314 is formed to have a substantially quadrangular shape, and an outer size (size) of each of the lower electrodes 310, the variable resistance layers 311, and the source conducting portions 314 is smaller than that of the N$^+$ region 306. With this configuration, as shown in FIG. 29, the variable resistance element array 300 (crosspoint memory array) is formed, in which the plate line 316 and the bit line 318 are connected to each other by the variable resistance element 30 (memory cell), and FETs 320 and 321 connected to the variable resistance element 30, and the gate electrodes 304 of the FETs 320 and 321 are connected to the word lines 315A and 315B extending in the a direction.

The gate electrode 304 is made of CoSi for example. The gate conducting portion 313 and the source conducting portion 314 are made of tungsten for example. The word line 315A, the word line 315B, the plate line 316, and the bit line 318 are made of, for example, Pt, Ir, IrO$_x$, or RuO$_x$ (x is 0 to 2). The insulating layer 317 is made of, for example, silicon oxide or silicon nitride. The N$^+$ region 203 is obtained by, for example, implanting P ions in a silicon substrate. The thickness (depth) of the N$^+$ region 203 is about 100 nm for example. The thickness (depth) of the insulating layer 317 is 300 nm for example. The thicknesses (depths) of the word line 315A, the word line 315B, the bit line 318, and the plate line 316 are, for example, 100 nm, 100 nm, 100 nm, and 100 nm, respectively. The widths of the word line 315A, the word line 315B, the bit line 318, and the plate line 316 are, for example, 1.1 μm, 1.1 μm, 2 μm, and 2 μm, respectively.

Figure 20:
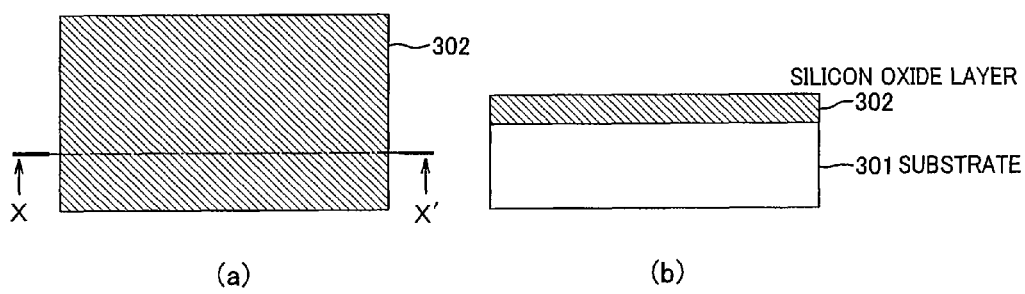
FIG. 20 are diagrams showing a step of forming the silicon oxide layer on the substrate, in the method for manufacturing the variable resistance element in Embodiment 3 of the present invention.
Figure 21:
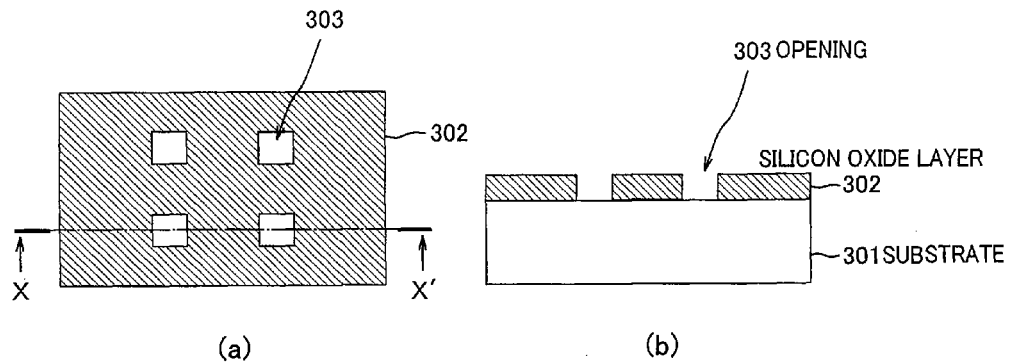
FIG. 21 are diagrams showing a step of forming openings on the silicon oxide layer to form therein gate electrodes, in the method for manufacturing the variable resistance element in Embodiment 3 of the present invention.
Figure 22:
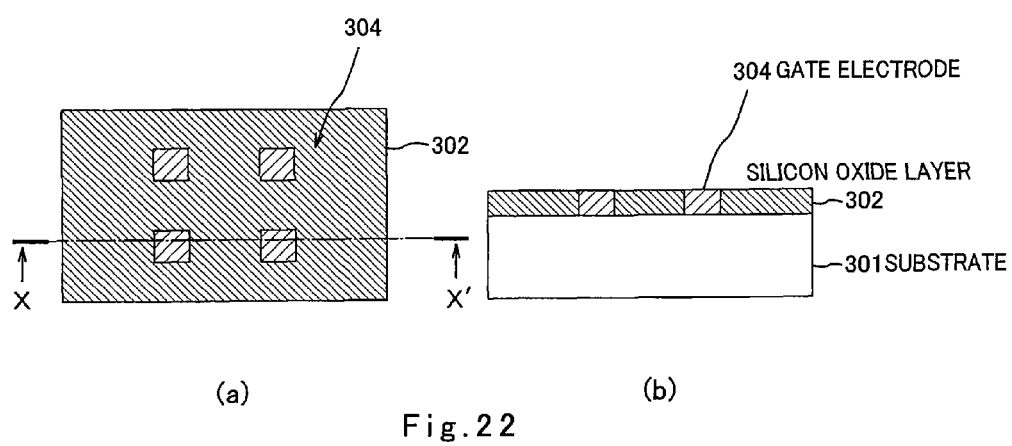
FIG. 22 are diagrams showing a step of forming the gate electrodes, in the method for manufacturing the variable resistance element in Embodiment 3 of the present invention.
Figure 23:
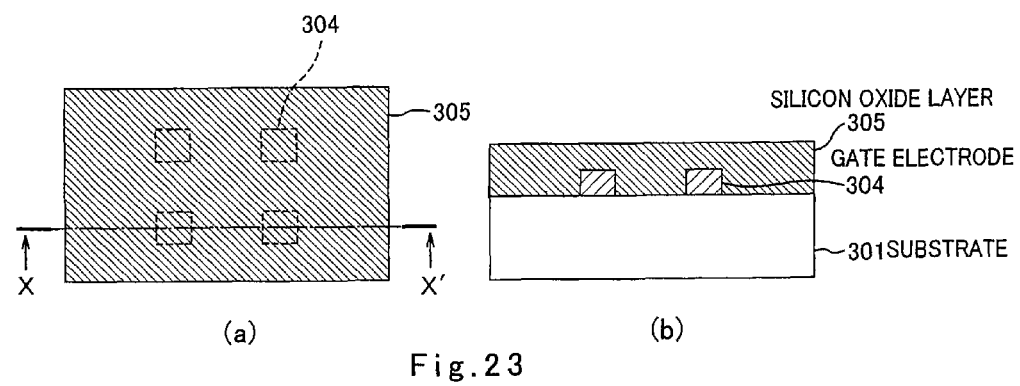
FIG. 23 are diagrams showing a step of forming the silicon oxide layer over the gate electrodes, in the method for manufacturing the variable resistance element in Embodiment 3 of the present invention.
Figure 24:
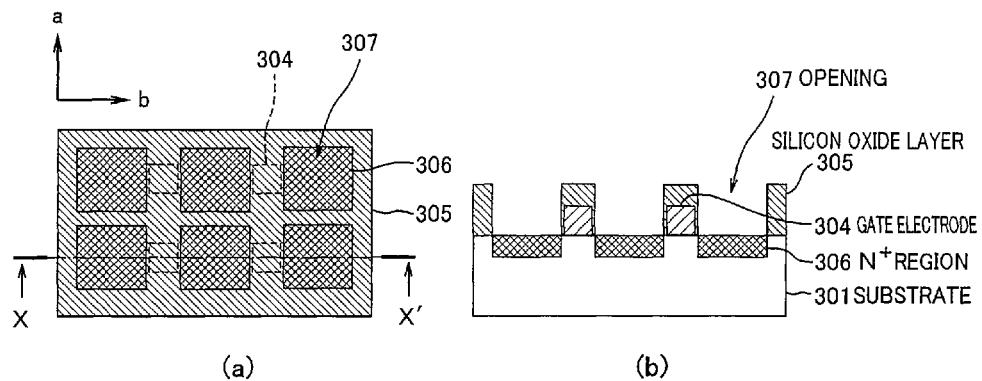
FIG. 24 are diagrams showing a step of forming the $N^+$ regions on a silicon substrate, in the method for manufacturing the variable resistance element in Embodiment 3 of the present invention.
Figure 25:
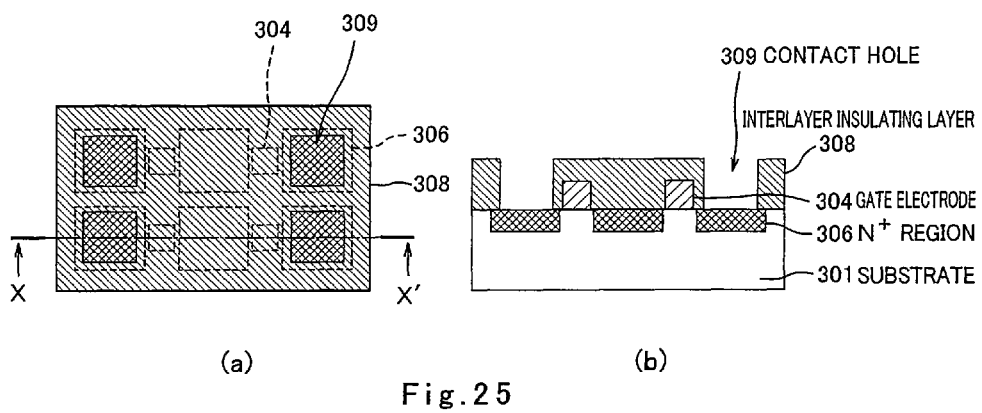
FIG. 25 are diagrams showing a step of forming openings to deposit therein the lower electrodes, in the method for manufacturing the variable resistance element in Embodiment 3 of the present invention.
Figure 26:
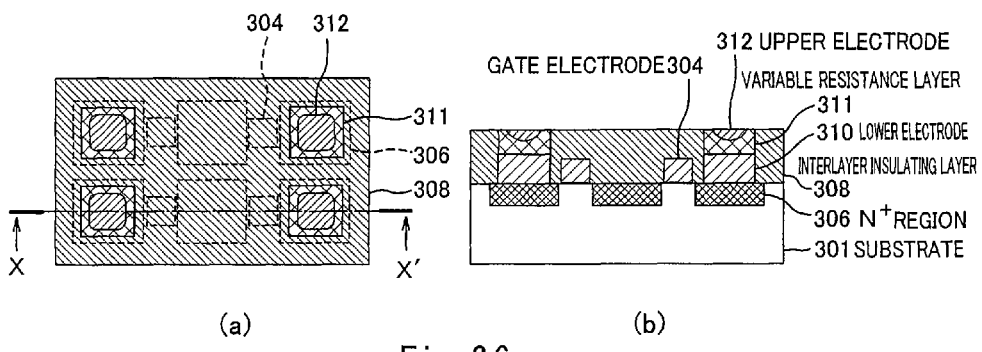
FIG. 26 are diagrams showing a step of forming the lower electrodes, the variable resistance layers, and the upper electrodes, in the method for manufacturing the variable resistance element in Embodiment 3 of the present invention.
Figure 27:
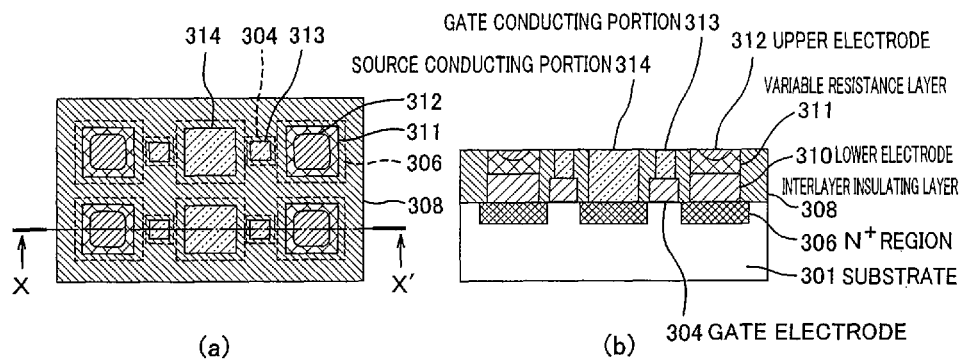
FIG. 27 are diagrams showing a step of forming gate conducting portions and source conducting portions, in the method for manufacturing the variable resistance element in Embodiment 3 of the present invention.

FIGS. 20 to 28 are diagrams showing respective steps of the method for manufacturing the variable resistance element array 300 in Embodiment 3 of the present invention. Each of FIGS. 20(*a*) to 28(*a*) is a schematic diagram showing an upper surface, and each of FIGS. 20(*b*) to 28(*b*) is a schematic diagram showing a cross section taken along line X-X' of each of FIGS. 20(*a*) to 28(*a*). FIG. 20 is a diagram showing a step of forming the silicon oxide layer on the substrate. FIG. 21 is a diagram showing a step of forming the openings on the silicon oxide layer to form therein the gate electrodes. FIG. 22 is a diagram showing a step of forming the gate electrodes. FIG. 23 is a diagram showing a step of forming the silicon oxide layer over the gate electrodes. FIG. 24 is a diagram showing a step of forming the N$^+$ regions on the silicon substrate. FIG. 25 is a diagram showing a step of forming the openings to deposit therein the lower electrodes. FIG. 26 is a diagram showing a step of forming the lower electrodes, the variable resistance layers, and the upper electrodes. FIG. 27 is a diagram showing a step of forming the gate conducting portions and the source conducting portions. FIG. 28 is a diagram showing a step of forming the word lines, the bit lines, and the plate lines. Hereinafter, the method for manufacturing the variable resistance element 30 in Embodiment 2 of the present invention will be explained in reference to FIGS. 20 to 28.

In the method for manufacturing the variable resistance element 30 in Embodiment 3 of the present invention, first, a silicon oxide layer 302 is deposited on the substrate 301 (step of FIG. 20). Next, the silicon oxide layer 202 is subjected to patterning and etching, and thereby openings 303 for forming therein the gate electrodes are formed at predetermined intervals (step of FIG. 21). Next, using the silicon oxide layers 202 as masks, the gate electrodes 304 are formed in the openings 303 by sputtering, CVD, or the like (step of FIG. 22). Next, a silicon oxide layer 305 is deposited to cover the gate electrodes 304 (step of FIG. 23). Next, the silicon oxide layer 305 is subjected to patterning and etching using lithography, thereby forming openings 307 to form therein the $N^+$ regions 306, and the P ion is implanted from above at the bottom of the opening 307, thereby forming the well-type $N^+$ region 306 (step of FIG. 24). Next, the silicon oxide layer 305 is removed, the interlayer insulating layer 308 is formed, and openings 309 for depositing therein the lower electrodes 310, the variable resistance layers 311, and the upper electrodes 312 are formed (step of FIG. 25). Next, the lower electrode 310, the variable resistance layer 311, and the upper electrode 312 are stacked in each opening 309 (step of FIG. 26). Since the step of FIG. 26 is the same as the step in Embodiment 1, a detailed explanation thereof is omitted. Next, openings for forming therein the gate conducting portion 313 and the source conducting portion 314 are formed by patterning and etching, and the gate conducting portion 313 and the source conducting portion 314 are deposited (step of FIG. 27). Next, the word line 315A, the word line 315B, and the plate line 316 are formed by patterning, and sputtering, CVD, or the like, the insulating layer 317 is formed thereon and subjected to patterning and etching, and the bit lines 318 are formed by sputtering, CVD, or the like, thereby forming the variable resistance element array 300 (step of FIG. 28).

Next, the operation of the variable resistance element 30 configured and manufactured as above will be explained based on FIG. 29. The variable resistance element array 300 of the present embodiment includes two word lines 315A and 315B for each plate line 316. The writing operation (application of the voltage pulse) with respect to the variable resistance element 30 is carried out in accordance with the following procedure. First, a combination of the bit line 318 and the plate line 316 is determined. Next, one of the word lines 315A and 315B adjacent to the plate line 316 is selected, and the voltage is applied to the plate line. At this time, an FET 321 is turned on by the application of the voltage to the word line 315A, and an FET 320 is turned on by the application of the voltage to the word line 315B. One of the FETs is selectively turned on, and at the same time, the voltage pulse is applied between the bit line 318 and plate line 316 of the combination. By such operation, the voltage pulse is selectively applied to only one of two variable resistance elements 30 connecting the bit line 318 and the plate line 316. Since the magnitude of the voltage pulse, the application time of the voltage pulse, the resistance value of the variable resistance element 30, and the like are the same as those of Embodiment 1, explanations thereof are omitted.

As with the writing operation, the readout operation of the digital data stored in the variable resistance element 30 is carried out as follows: one of the FETs is selectively turned on, and at the same time, a constant current is applied between the upper electrode 312 and the lower electrode 310; and a voltage generated between the upper electrode 312 and the lower electrode 310 is detected. Since the magnitude of the applied current and the like are the same as those of Embodiment 1, explanations thereof are omitted.

The variable resistance element 30 of the present embodiment has the same features and effects as the variable resistance element 10 of Embodiment 1. Further, in the variable resistance element 30, an FET is disposed under the lower electrode 308, and the bit line and the plate line are electrically connected to each other via the FET. With this configuration, the cross talk between the memory cells decreases. To be specific, in the variable resistance element 10 of Embodiment 1, current may flow through adjacent memory cells depending on the configuration of the memory cell and the applied voltage or current. If the current flows through an unintended path, the power consumption may increase due to excess current, and the voltage pulse of a desired magnitude may not be applied to a target memory cell for a desired period of time. In the variable resistance element 30 of the present embodiment, the FETs 320 and 321 can be turned on and off by changing the voltage applied to the word line 315A and the word line 315B. Therefore, by turning on only the FET(s) of a desired portion (column), the current is prevented from flowing backward, thereby improving the energy efficiency and the accuracy of the operation of the memory at the same time.

Moreover, the method for manufacturing the variable resistance element in the present embodiment has the same features as that in Embodiment 1. Further, in accordance with the manufacturing method of the present embodiment, the crosspoint memory array can be manufactured, in which two variable resistance elements (memory cells) electrically connected to each other via the FET are disposed for each intersection point of the bit line and the plate line.

Embodiment 4

The variable resistance element of Embodiment 4 of the present invention is different from the variable resistance element of Embodiment 1 in that the lower electrode is convex (curves upwardly) with respect to the variable resistance layer in Embodiment 4 whereas the upper electrode is convex in Embodiment 1. Since the materials and sizes in the configuration are the same as those of Embodiment 1, explanations thereof are omitted.

Figure 36:
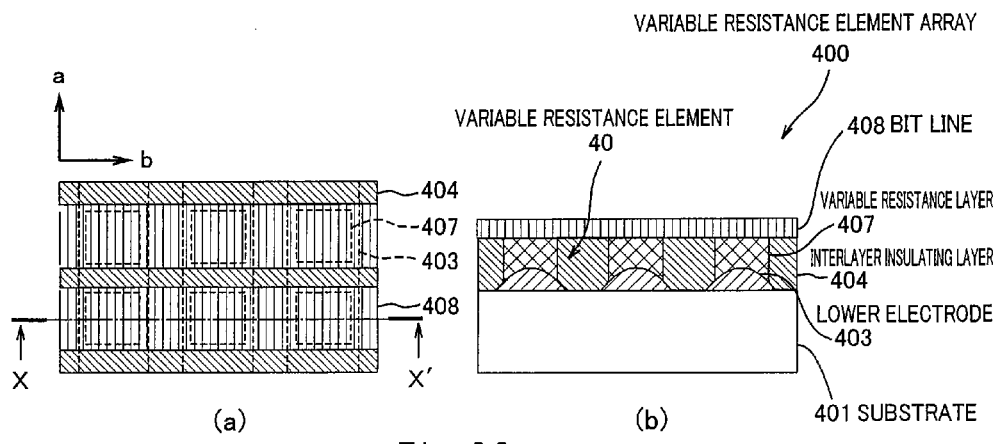
FIG. 36 are diagrams showing a step of forming the upper electrodes, in the method for manufacturing the variable resistance element in Embodiment 4 of the present invention.

FIG. 36 are schematic diagrams showing one example of the configuration of the variable resistance element of Embodiment 4 of the present invention. FIG. 36(a) is a top view, and FIG. 36(b) is a cross-sectional view taken along line x-x' of FIG. 36(a). Since the electrical equivalent circuit is the same as that of FIG. 10, an explanation thereof is omitted. Hereinafter, the configuration of a variable resistance element 40 of the present embodiment will be explained in reference to FIG. 36.

As shown in FIGS. 36(a) and 36(b), a plurality of the variable resistance elements 40 according to the present embodiment are integrated to constitute a variable resistance element array 400. The variable resistance element array 400 includes a substrate 401. A plurality of band-shaped lower electrodes 403 are formed on the substrate 101 so as to be in parallel with each other with predetermined pitches. The lower electrode 403 is formed to be upwardly convex along a central axis extending in a longitudinal direction of the lower electrode 103. The lower electrode 403 also functions as a word line. A plurality of island-shaped variable resistance layers 407 are formed on each lower electrode so as to be space apart from each other in a longitudinal direction of the lower electrode. An interlayer insulating layer 404 is formed to fill in spaces between the lower electrodes 403 and spaces between the variable resistance layers 407. An upper surface of the interlayer insulating layer 404 and upper surfaces of the variable resistance layers 407 form a substantially flat surface. A plurality of band-shaped upper electrodes (bit lines) 408 are formed on this substantially flat surface. The upper electrodes 408 are formed to be in parallel with each other with predetermined pitches. In plan view, the upper electrodes 408 are formed to be orthogonal to the lower electrodes 403 (word lines), and the island-shaped variable resistance layers 407 are formed at respective intersection points of the upper electrodes 408 and the lower electrodes 403. In plan view, the variable resistance layer 407 is formed to have a substantially quadrangular shape, and an outer size (size) of the variable resistance layer 407 is smaller than the width of the upper electrode 408 and the width of the lower electrode 403. With this configuration, the variable resistance element array 400 (crosspoint memory array) is formed, in which the variable resistance elements 40 are formed in a matrix at respective intersection points of the upper electrodes 408 extending in the b direction and the lower electrodes 403 extending in the a direction.

Figure 30:
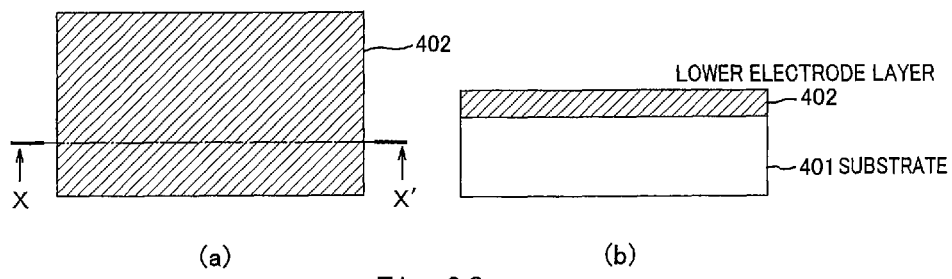
FIG. 30 are diagrams showing a step of forming the lower electrode film on the substrate, in the method for manufacturing the variable resistance element in Embodiment 4 of the present invention.
Figure 31:
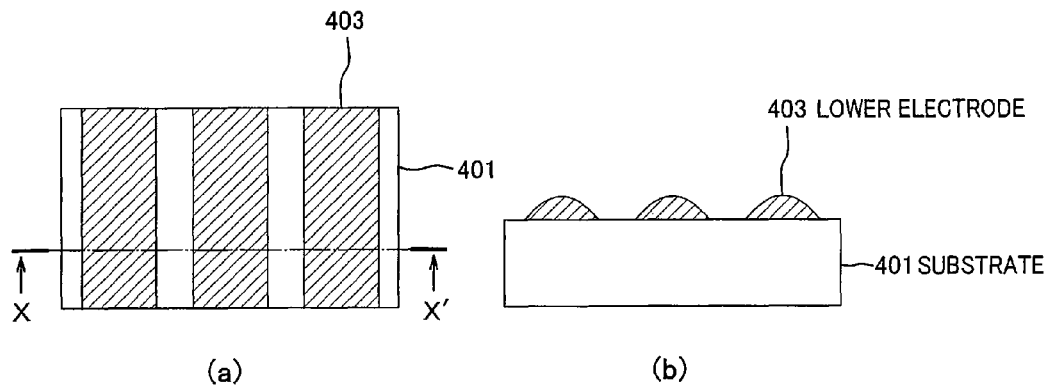
FIG. 31 are diagrams showing a step of forming the lower electrodes, in the method for manufacturing the variable resistance element in Embodiment 4 of the present invention.
Figure 32:
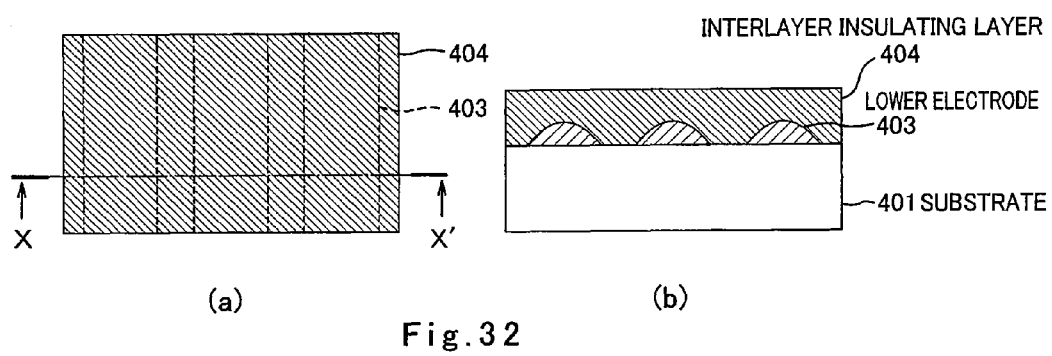
FIG. 32 are diagrams showing a step of forming the interlayer insulating layer, in the method for manufacturing the variable resistance element in Embodiment 4 of the present invention.
Figure 33:
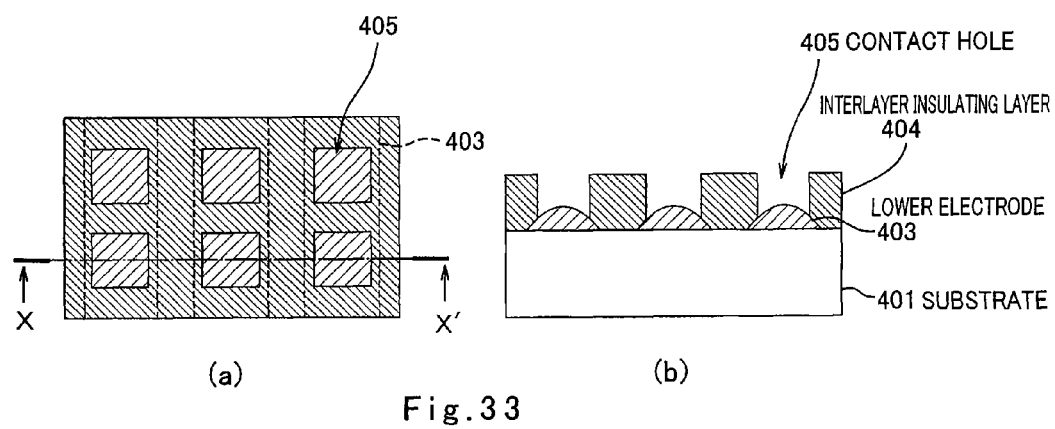
FIG. 33 are diagrams showing a step of forming the contact holes, in the method for manufacturing the variable resistance element in Embodiment 4 of the present invention.
Figure 34:
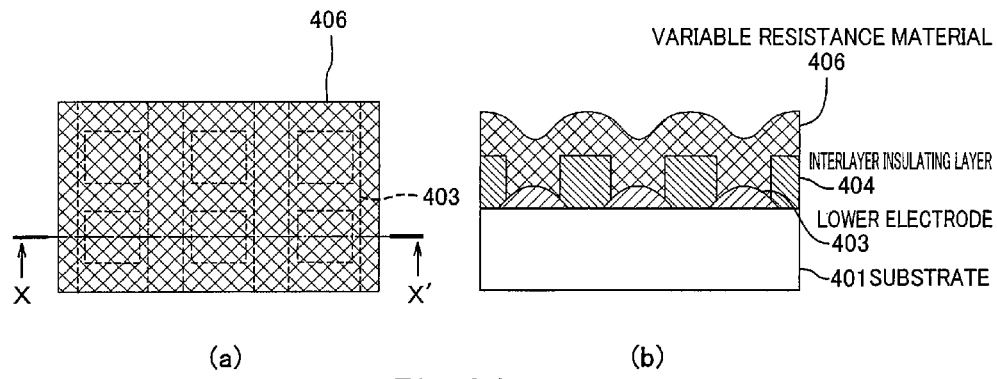
FIG. 34 are diagrams showing a step of depositing the variable resistance material, in the method for manufacturing the variable resistance element in Embodiment 4 of the present invention.
Figure 35:
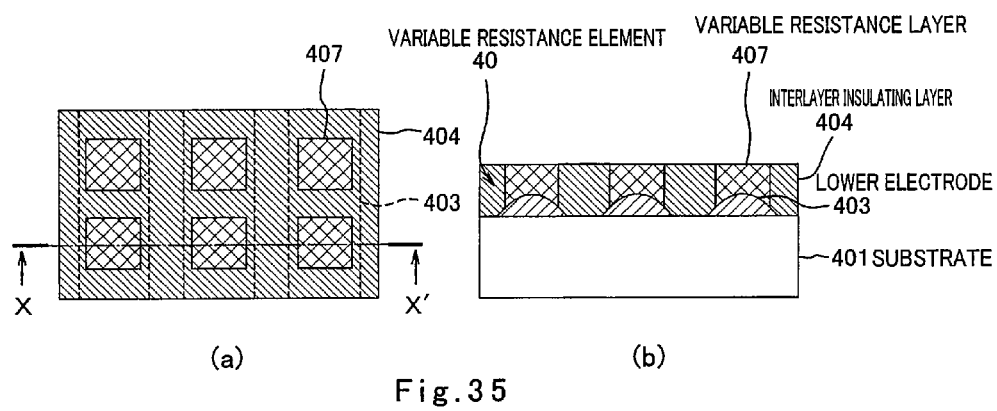
FIG. 35 are diagrams showing a step of forming the variable resistance layers, in the method for manufacturing the variable resistance element in Embodiment 4 of the present invention.

FIGS. 30 to 36 are diagrams showing respective steps of the method for manufacturing the variable resistance element 40 in Embodiment 4 of the present invention. Each of FIGS. 30(a) to 36(a) is a schematic diagram showing an upper surface, and each of FIGS. 30(b) to 36(b) is a schematic diagram showing a cross section taken along line X-X' of each of FIGS. 30(a) to 36(a). FIG. 30 is a diagram showing a step of forming the lower electrode film on the substrate. FIG. 31 is a diagram showing a step of forming the lower electrodes. FIG. 32 is a diagram showing a step of forming the interlayer insulating layer. FIG. 33 is a diagram showing a step of forming the contact holes. FIG. 34 is a diagram showing a step of depositing the variable resistance material. FIG. 35 is a diagram showing a step of forming the variable resistance layers. FIG. 36 is a diagram showing a step of forming the upper electrodes. Hereinafter, the method for manufacturing the variable resistance element 40 in Embodiment 4 of the present invention will be explained in reference to FIGS. 30 to 36.

In the method for manufacturing the variable resistance element 40 in Embodiment 4 of the present invention, first, a lower electrode film 402 is deposited on the substrate 401 (step of FIG. 30). Next, the lower electrode film 402 is subjected to patterning by dry etching, and thereby the lower electrodes 403 each having a predetermined width are formed to be in parallel with each other with predetermined pitches (step of FIG. 31). In this step, an incidence angle of an etching ion with respect to a wafer surface is set to 90 degrees to expose the substrate. The incidence angle is changed to 45 degrees to form a taper. After forming the lower electrodes 403, the interlayer insulating layer 404 is deposited (step of FIG. 32). Next, contact holes 405, each of which reaches the lower electrode 403, are formed on the interlayer insulating layer 404 at predetermined intervals (step of FIG. 33). Next, a variable resistance material film 406 is formed by MOD or MOCVD to cover the contact holes 405 (step of FIG. 34). Next, the variable resistance material film 406 is smoothed by the CMP or the like, thereby forming the variable resistance layer 407 and element-isolating the variable resistance elements 40 (step of FIG. 35). The upper surface of the interlayer insulating layer 404 and the upper surfaces of the variable resistance layers 407 form the substantially flat surface. Next, the upper electrodes 408 (bit lines) each having a predetermined width are formed on this substantially flat surface so as to be orthogonal to the lower electrodes 403, cover (be electrically connected to) the variable resistance layers 407, and be in parallel with each other with predetermined pitches, thereby forming the variable resistance element array 400 (step of FIG. 36).

Since the operations (the writing operation and the readout operation) of the variable resistance element 40 of the present embodiment are the same as those of Embodiment 1, explanations thereof are omitted.

A feature of the variable resistance element 40 of the present embodiment is that the lower electrode 403 is convex with respect to the variable resistance layer 407. More specifically, regarding the upper surface of the lower electrode 403, a portion of the central axis extending in the longitudinal direction projects upwardly as compared to portions on both sides of the portion of the central axis. With this configuration, the distance between the lower electrode 403 and the upper electrode 408 is shorter at the central portion than at the peripheral portion. Therefore, as with the variable resistance element 10 of Embodiment 1, the variable resistance element is less affected by the deterioration of the variable resistance material of the peripheral portion, thereby improving operation stability and reliability. To be specific, it is possible to suppress the malfunctions of the variable resistance element caused due to the deterioration of the variable resistance material which occurs in manufacturing steps.

The method for manufacturing the variable resistance element in the present embodiment is different from that in Embodiment 1 in that after forming the lower electrode having a convex shape, the variable resistance material is deposited thereon. With this manufacturing method of the present embodiment, it is possible to manufacture the variable resistance element in which the central portion of one of a pair of electrodes is convex with respect to the variable resistance layer.

Embodiment 5

Figure 37:
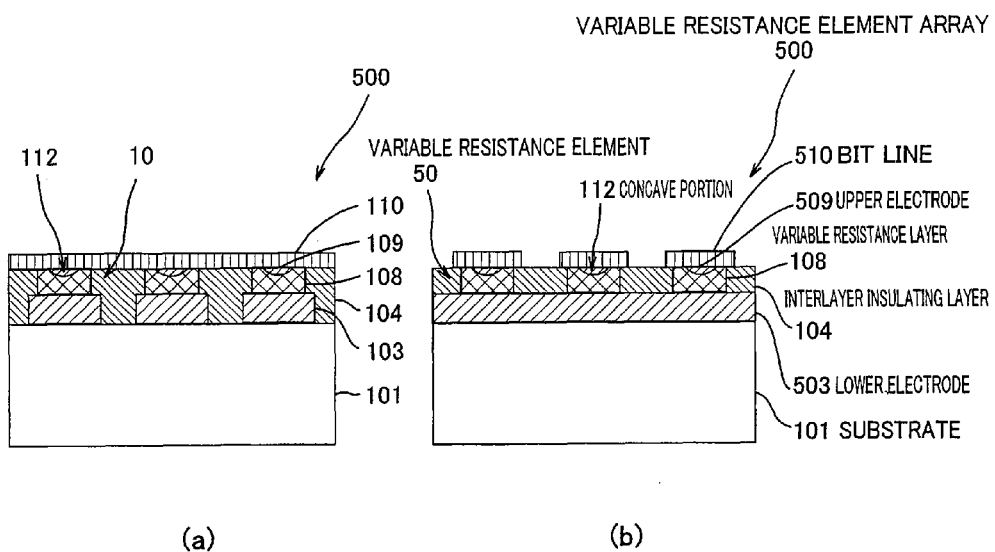
FIG. 37 are schematic diagrams showing one example of the configuration of a cross section of the variable resistance element of Embodiment 5 of the present invention.

FIG. 37 are cross-sectional views showing one example of the configuration of a cross section of the variable resistance element of Embodiment 5 of the present invention. FIG. 37(a) is a cross-sectional view showing a cross section parallel to a bit line, and FIG. 37(b) is a cross-sectional view showing a cross section parallel to a word line. Hereinafter, the configuration of a variable resistance element 50 of the present embodiment will be explained in reference to FIG. 37.

As shown in FIGS. 37(a) and 37(b), the variable resistance element 50 according to the present embodiment is obtained by replacing, in the variable resistance element 10 according to Embodiment 1, the lower electrodes 103 with lower electrodes 503, the upper electrodes 109 with upper electrodes 509, and the bit lines 110 with bit lines 510. A plurality of the variable resistance elements 50 are integrated to constitute the variable resistance element array 500. Other than the above, the variable resistance element 50 and the variable resistance element 10 are similar to each other. Therefore, same reference numbers and names are used for common components, and explanations of those components are omitted.

The bit lines 510 are made of, for example, Al, Cu, TiN or Ti. Each of the lower electrodes 503 and the upper electrodes 509 is made of, for example, Pt or TaN. To be specific, in the present embodiment, the electrode (the lower electrodes 503 and the upper electrodes 509) and the wire (the bit lines 510) are made of different materials. Therefore, in the present embodiment, the electrode (the lower electrode 503 and the upper electrode 509) and the wire (the bit line 510) are apparently different members. It is preferable that the thickness of the lower electrode 503 be 100 nm to 200 nm. It is preferable that the thickness of the bit line 510 be 100 nm to 200 nm. The width of the lower electrode 503 is about 1.2 μm for example. The gap (space) between adjacent lower electrodes 503 is about 0.5 μm for example (the pitch is about 1.7 μm). Since the shape of the concave portion 112 and the like are the same as those of Embodiment 1, explanations thereof are omitted. In the present embodiment, reflecting the manufacturing method, the upper electrode 509 (material forming the upper electrode 509) exists only in an inner portion (portion lower than the upper end surface of the interlayer insulating layer 104, or portion lower than the upper end of the contact hole 105) of the hole (contact hole 105 in FIG. 5) formed on the interlayer insulating layer 104. Moreover, the upper electrode 509 and the interlayer insulating layer 104 do not contact each other, and the variable resistance layer 108 surrounds the upper end of the upper electrode 509. To be specific, at an inner peripheral portion of the upper end of the hole (the contact hole 105 in FIG. 5) formed on the interlayer insulating layer 104, only the variable resistance layer 108 exists, and the upper electrode 509 (material forming the upper electrode 509) does not exist.

The method for manufacturing the variable resistance element 50 is the same as the method for manufacturing the variable resistance element in Embodiment 1 shown in FIGS. 2 to 9. That is, the variable resistance element 50 can be manufactured by replacing, in the above explanation of the manufacturing method of Embodiment 1, the lower electrodes 103 with the lower electrodes 503, the upper electrodes 109 with the upper electrodes 509, and the bit lines 110 with the bit lines 510. Therefore, a detailed explanation of the manufacturing method is omitted.

Since the operation of the variable resistance element 50 is the same as the operation of the variable resistance element 10 of Embodiment 1, an explanation thereof is omitted. That is, the variable resistance element 50 can be operated by replacing, in the above explanation of the operation of Embodiment 1, the lower electrodes 103 with the lower electrodes 503, the upper electrodes 109 with the upper electrodes 509, and the bit lines 110 with the bit lines 510. Therefore, a detailed explanation of the operation is omitted.

Needless to say, the variable resistance element 50 of the present embodiment also has the same features and effects as the variable resistance element 10. Further, the variable resistance element 50 has the following features. That is, an electrode material is generally expensive, and it is necessary to reduce the used amount of the electrode material. Meanwhile, since wires (bit lines and the like) need to be formed over the entire surface of the element, a large amount of materials are required. In the variable resistance element 50, the material forming the electrode and the material forming the wire (bit line) are different from each other, and the used amount of the material necessary for forming the upper electrode 509 is minimized. Therefore, the manufacturing cost can be reduced significantly. Moreover, since the wire and the electrode are made of different materials, a limited material, such as Al or Cu, can be used for the wire, and at the same time, a preferable material can be used for the electrode to surely cause the resistance change.

Modification Examples of Embodiments 1 to 5

Figure 38:
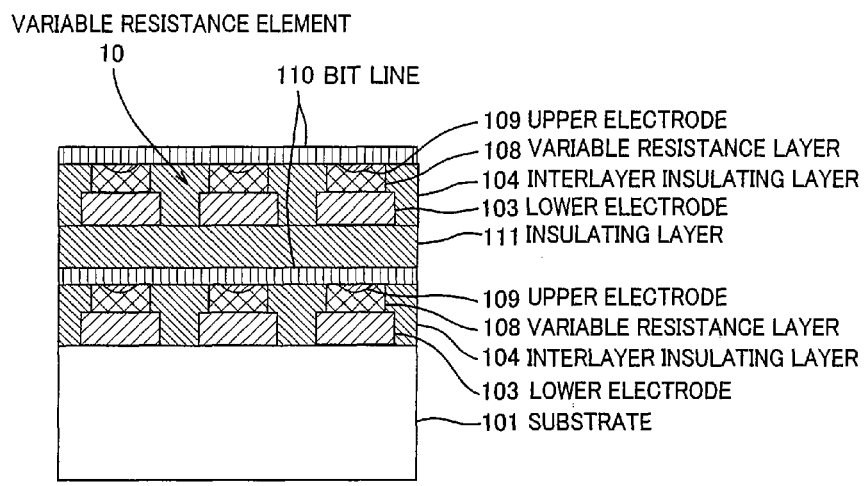
FIG. 38 is a diagram schematically showing a cross section of a crosspoint configuration memory having a stack structure formed by stacking the variable resistance elements of Embodiment 1.
Figure 39:
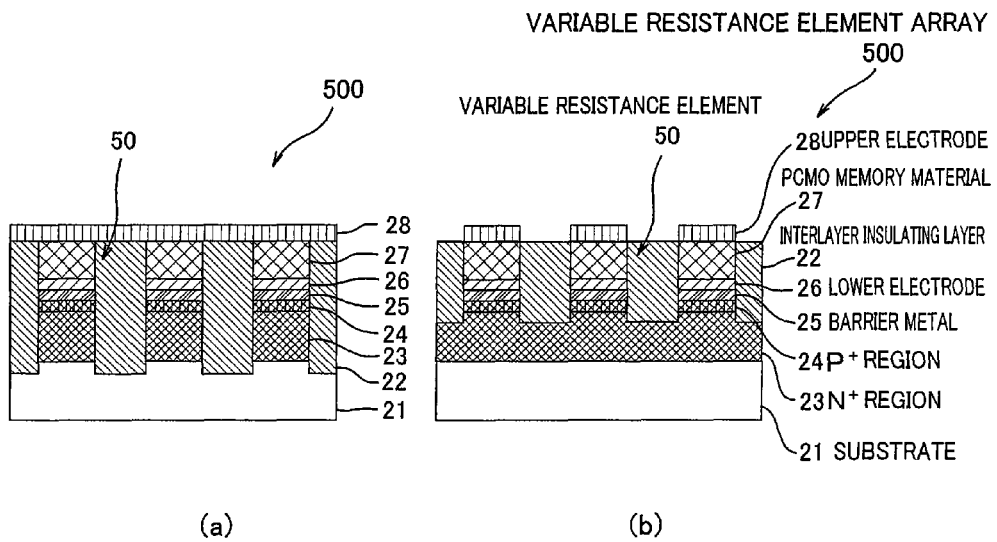
FIG. 39 are schematic diagrams showing one example of the configuration of a cross section of the variable resistance element of the prior art.

A variable resistance element array (crosspoint configuration memory) having a stack structure may be formed by stacking the variable resistance element arrays of Embodiments 1 to 5. FIG. 38 is a diagram schematically showing a cross section of a variable resistance element array having a stack structure formed by stacking the variable resistance element arrays of Embodiment 1. As shown in FIG. 38, the variable resistance element array 100 of Embodiment 1 is formed on the substrate 101, an insulating layer 111 made of silicon oxide or the like is deposited, and the steps of Embodiment 1 are repeated. Thus, it is possible to manufacture the variable resistance element array in which the variable resistance element arrays are stacked.

Alternatively, a semiconductor device may be formed by attaching a known peripheral circuit to the variable resistance element of Embodiments 1 to 5.

In the variable resistance element of Embodiments 1 to 5, even if the voltage applied to the electrode is zero, the resistance value of the variable resistance layer is maintained. The difference (ON/OFF) of the resistance value is easily obtained from, for example, the relation between the applied current and the measured voltage. Therefore, a nonvolatile memory may be formed by attaching a known peripheral circuit to the variable resistance element of Embodiments 1 to 4.

From the foregoing explanation, many modifications and other embodiments of the present invention are obvious to one skilled in the art. Therefore, the foregoing explanation should be interpreted only as an example, and is provided for the purpose of teaching the best mode for carrying out the present invention to one skilled in the art. The structures and/or functional details may be substantially modified within the spirit of the present invention.

INDUSTRIAL APPLICABILITY

A variable resistance element, a semiconductor device, and a method for manufacturing the variable resistance element according to the present invention are useful as a variable resistance element, a semiconductor device, and a method for manufacturing the variable resistance element, each of which is capable of improving the malfunctions of the variable resistance element.

The invention claimed is:

1. A method for manufacturing a variable resistance element, comprising the steps of:
   depositing a variable resistance material in a contact hole, which is formed on an interlayer insulating layer on a substrate and has a lower electrode at a bottom portion thereof, such that an upper surface of the variable resistance material in the contact hole is located lower than an upper surface of the interlayer insulating layer;
   depositing an upper electrode material on the deposited variable resistance material such that an upper surface of the upper electrode material in the contact hole is located higher than the upper surface of the interlayer insulating layer; and
   element-isolating by a CMP the variable resistance element including the variable resistance material and the upper electrode material which is stacked on the variable resistance material.

2. The method according to claim 1, wherein the step of depositing the variable resistance material is carried out by MOD or MOCVD.

3. A method for manufacturing a variable resistance element, comprising the steps of:
   forming a lower electrode film on a substrate;
   etching the lower electrode film to form lower electrodes, each having a predetermined width such that the lower electrodes are arranged in a width direction of the lower electrode with predetermined pitches;

covering the lower electrodes with silicon oxide or silicon nitride to form an interlayer insulating layer;

patterning and etching the interlayer insulating layer to form contact holes, which are communicated with the lower electrodes;

depositing a variable resistance material by MOD or MOCVD such that an upper surface of the variable resistance material in the contact hole is located lower than an upper surface of the interlayer insulating layer;

depositing an upper electrode material on the deposited variable resistance material such that an upper surface of the upper electrode material in the contact hole is located higher than the upper surface of the interlayer insulating layer; and element-isolating by a CMP the variable resistance element including the variable resistance material and the upper electrode material which is stacked on the variable resistance material.

4. A variable resistance element comprising:
a substrate;
a lower electrode formed on the substrate;
a variable resistance layer which is formed on the lower electrode and whose resistance value changes in accordance with an applied voltage pulse;
an upper electrode formed on the variable resistance layer; and
an insulating layer formed on the substrate, wherein:
the insulating layer is provided with a contact hole;
the variable resistance layer and the upper electrode are formed only below an upper end of the contact hole;
the upper electrode is formed to be convex toward the substrate; and
the variable resistance layer exists in an inner peripheral portion of the upper end in the contact hole whereas the upper electrode does not exist in this inner peripheral portion.

5. The variable resistance element according to claim 4, wherein the convexity is only one.

6. The variable resistance element according to claim 4, wherein the convex surface of the electrode projects such that a projection amount thereof toward the variable resistance layer continuously increases from a peripheral portion of the electrode to a central portion of the electrode.

7. The variable resistance element according to claim 4, wherein in a cross section taken along a thickness direction of the variable resistance layer, a boundary formed by the convex surface is a bow-like curved shape.

8. The variable resistance element according to claim 4, wherein the convex surface has a bowl shape.

9. The variable resistance element according to claim 4, wherein a diode is formed on the substrate so as to be electrically connected to the lower electrode.

10. The variable resistance element according to claim 4, wherein a field effect transistor is formed on the substrate so as to be electrically connected to the lower electrode.

11. A semiconductor device comprising a nonvolatile memory portion in which a plurality of the variable resistance elements according to claim 4 are formed in a matrix.

12. A semiconductor device formed by stacking nonvolatile memory portions, in each of which a plurality of the variable resistance elements according to claim 4 are formed in a matrix.

* * * * *